(12) United States Patent
Lee et al.

(10) Patent No.: US 10,644,089 B2
(45) Date of Patent: May 5, 2020

(54) DISPLAY DEVICE AND MANUFACTURING METHOD THEREOF

(71) Applicant: SAMSUNG DISPLAY CO., LTD., Yongin-si, Gyeonggi-Do (KR)

(72) Inventors: Jun Hee Lee, Yongin-si (KR); In Jun Bae, Yongin-si (KR); Kohei Ebisuno, Yongin-si (KR)

(73) Assignee: SAMSUNG DISPLAY CO., LTD., Yongin-si, Gyeonggi-Do (KR)

( * ) Notice: Subject to any disclaimer, the term of this patent is extended or adjusted under 35 U.S.C. 154(b) by 0 days.

(21) Appl. No.: 15/611,482

(22) Filed: Jun. 1, 2017

(65) Prior Publication Data

US 2018/0114823 A1   Apr. 26, 2018

(30) Foreign Application Priority Data

Oct. 26, 2016 (KR) ........................ 10-2016-0140222

(51) Int. Cl.
*H01L 27/32* (2006.01)
*H01L 29/78* (2006.01)
(Continued)

(52) U.S. Cl.
CPC ....... *H01L 27/3262* (2013.01); *G09G 3/3233* (2013.01); *G09G 3/3241* (2013.01); *G09G 3/3258* (2013.01); *G09G 3/3266* (2013.01); *G09G 3/3291* (2013.01); *H01L 27/3248* (2013.01); *H01L 27/3265* (2013.01); *H01L 27/3272* (2013.01); *H01L 27/3276* (2013.01); *H01L 29/04* (2013.01); *H01L 29/78606* (2013.01); *H01L 29/78696* (2013.01); *G09G 2300/0426* (2013.01);
(Continued)

(58) Field of Classification Search
CPC ..... H01L 27/32; H01L 27/3262; H01L 29/78; H01L 29/04
See application file for complete search history.

(56) References Cited

U.S. PATENT DOCUMENTS 7,863,602 B2   1/2011   Huh et al.
8,294,158 B2   10/2012  Park et al.
(Continued)

FOREIGN PATENT DOCUMENTS

KR   10-1049808   7/2011
KR   10-1209041   12/2012
KR   10-1486038   1/2015

*Primary Examiner* — Fazli Erdem
(74) *Attorney, Agent, or Firm* — F. Chau & Associates, LLC

(57) ABSTRACT

A display device includes a scan line that extends in a first direction on a substrate and that transmits a scan signal; a data line that extends in a second direction that intersects the first direction and that transmits a data signal; a driving voltage line that extends in the second direction and that transmits a driving voltage; a transistor that includes a second transistor connected to the scan line and the data line and a first transistor connected to the second transistor; a light emitting device connected to the transistor; and a conductive pattern disposed between the substrate and the first transistor, where each of the first and second transistors includes an active pattern with a stacked first semiconductor layer and a second semiconductor layer, which have different crystalline states.

12 Claims, 19 Drawing Sheets

(51) Int. Cl.
*G09G 3/3233* (2016.01)
*G09G 3/3241* (2016.01)
*G09G 3/3258* (2016.01)
*G09G 3/3266* (2016.01)
*G09G 3/3291* (2016.01)
*H01L 29/04* (2006.01)
*H01L 29/786* (2006.01)
*H01L 27/12* (2006.01)

(52) U.S. Cl.
CPC . *G09G 2300/0452* (2013.01); *G09G 2310/08* (2013.01); *H01L 27/124* (2013.01); *H01L 27/127* (2013.01); *H01L 27/1255* (2013.01); *H01L 2227/323* (2013.01)

(56) References Cited

U.S. PATENT DOCUMENTS

| | | | |
|---|---|---|---|
| 9,450,040 B2 | 9/2016 | Kim et al. | |
| 9,530,829 B2 | 12/2016 | Yamazaki | |
| 2003/0010980 A1* | 1/2003 | Yamazaki | H01L 21/0237 257/65 |
| 2005/0225253 A1* | 10/2005 | Yamada | H01L 27/1214 315/169.3 |
| 2008/0153214 A1* | 6/2008 | Jung | H01L 21/02532 438/164 |
| 2009/0230397 A1* | 9/2009 | Noda | H01L 27/1229 257/59 |
| 2010/0181574 A1* | 7/2010 | Liu | H01L 27/1229 257/72 |
| 2011/0073863 A1* | 3/2011 | Asanuma | H01L 29/04 257/59 |
| 2011/0134045 A1* | 6/2011 | Chan | H01L 27/1229 345/168 |
| 2016/0005804 A1* | 1/2016 | Oh | H01L 51/0562 257/72 |
| 2017/0062545 A1* | 3/2017 | Oh | H01L 27/3276 |
| 2018/0076273 A1* | 3/2018 | Kim | H01L 27/3276 |
| 2018/0097016 A1* | 4/2018 | Yang | H01L 27/124 |

* cited by examiner

DISPLAY DEVICE AND MANUFACTURING METHOD THEREOF

CROSS REFERENCE TO RELATED APPLICATIONS

The present application claims priority under 35 U.S.C § 119 from, and the benefit of, Korean Patent Application No. 10-2016-0140222, filed on Oct. 26, 2016 in the Korean Intellectual Property Office, the contents of which are herein incorporated by reference in their entirety.

BACKGROUND

1. Technical Field

Embodiments of the present disclosure are directed to a display device and a manufacturing method thereof.

2. Discussion of the Related Art

As interest in information displays and demand for portable information media increase, research and commercialization has centered on display devices.

In particular, as the requirement for higher resolution has increased, the size of a pixel has decreased. On the other hand, the structure of a circuit included in the pixel has become more complicated.

SUMMARY

Embodiments of the present disclosure can provide a display device and a manufacturing method thereof, which facilitates the implementation of high resolution.

According to an embodiment of the present disclosure, there is provided a display device including: a scan line that extends in a first direction on a substrate, wherein the scan line transmits a scan signal; a data line that extends in a second direction that intersects the first direction, where the data line transmits a data signal; a driving voltage line that extends in the second direction, where the driving voltage line transmits a driving voltage; a transistor that includes a second transistor connected to the scan line and the data line and a first transistor connected to the second transistor; a light emitting device connected to the transistor; and a conductive pattern disposed between the substrate and the first transistor. Each of the first and second transistors includes an active pattern with a stacked first semiconductor layer and a second semiconductor layer, which have different crystalline states.

The first semiconductor layer may be disposed under the second semiconductor layer and have a smaller crystalline particle than the second semiconductor layer.

The display device may include a storage capacitor between the substrate and the first semiconductor layer, where the storage capacitor includes the conductive pattern, a metal layer that overlaps the conductive pattern, and a gate insulating layer interposed therebetween.

The conductive pattern may be a light blocking layer that blocks light incident into a bottom of the substrate, on which no active pattern is provided.

The display device may further include an auxiliary power line integrally formed with the conductive pattern.

The display device may further include an initialization power line that extends in the first direction, where the initialization power line transmits an initial fixed voltage.

The first transistor may include: a gate electrode integrally formed with the metal layer; the active pattern disposed on the gate electrode; and source and drain electrodes each connected to respective ends of the active pattern.

The display device may further include an anti-doping layer disposed on the active pattern.

The display device may further include a storage capacitor that includes a lower electrode disposed on the active pattern, an upper electrode that overlaps the lower electrode, and an insulating layer interposed therebetween.

The upper electrode may be integrally formed with the driving voltage line.

The lower electrode may be an anti-doping layer.

The first transistor may include: a gate electrode integrally formed with the conductive pattern; the active pattern disposed on the gate electrode; and source and drain electrodes each connected to respective ends of the active pattern.

According to an aspect of the present disclosure, there is provided a method of manufacturing a display device, the method including: forming a conductive pattern on a substrate; forming an interlayer insulating layer over the conductive pattern; forming an active pattern that includes a stacked first semiconductor layer and a second semiconductor layer having different crystalline states by depositing a semiconductor layer on the interlayer insulating layer and performing a crystallization process using laser; forming a first insulating layer over the active pattern; forming a gate pattern on the first insulating layer; forming a second insulating layer over the gate pattern; forming a data pattern on the second insulating layer; forming a protective layer over the data pattern; and forming a light emitting device disposed on the protective layer, the light emitting device being electrically connected to a portion of the data pattern.

According to another embodiment of the present disclosure, there is provided a display device that includes a transistor disposed on a substrate that includes a second transistor connected to a scan line and a data line and a first transistor connected to the second transistor; a light emitting device connected to the transistor; and a conductive pattern disposed between the substrate and the first transistor. Each of the first and second transistors includes an active pattern with a stacked first semiconductor layer and a second semiconductor layer, which have different crystalline states, the first semiconductor layer is disposed under the second semiconductor layer and has a smaller crystalline particle than the second semiconductor layer, and the conductive pattern is a light blocking layer that blocks light incident into a bottom surface of the substrate, on which no active pattern is provided.

DETAILED DESCRIPTION

Figure 1:
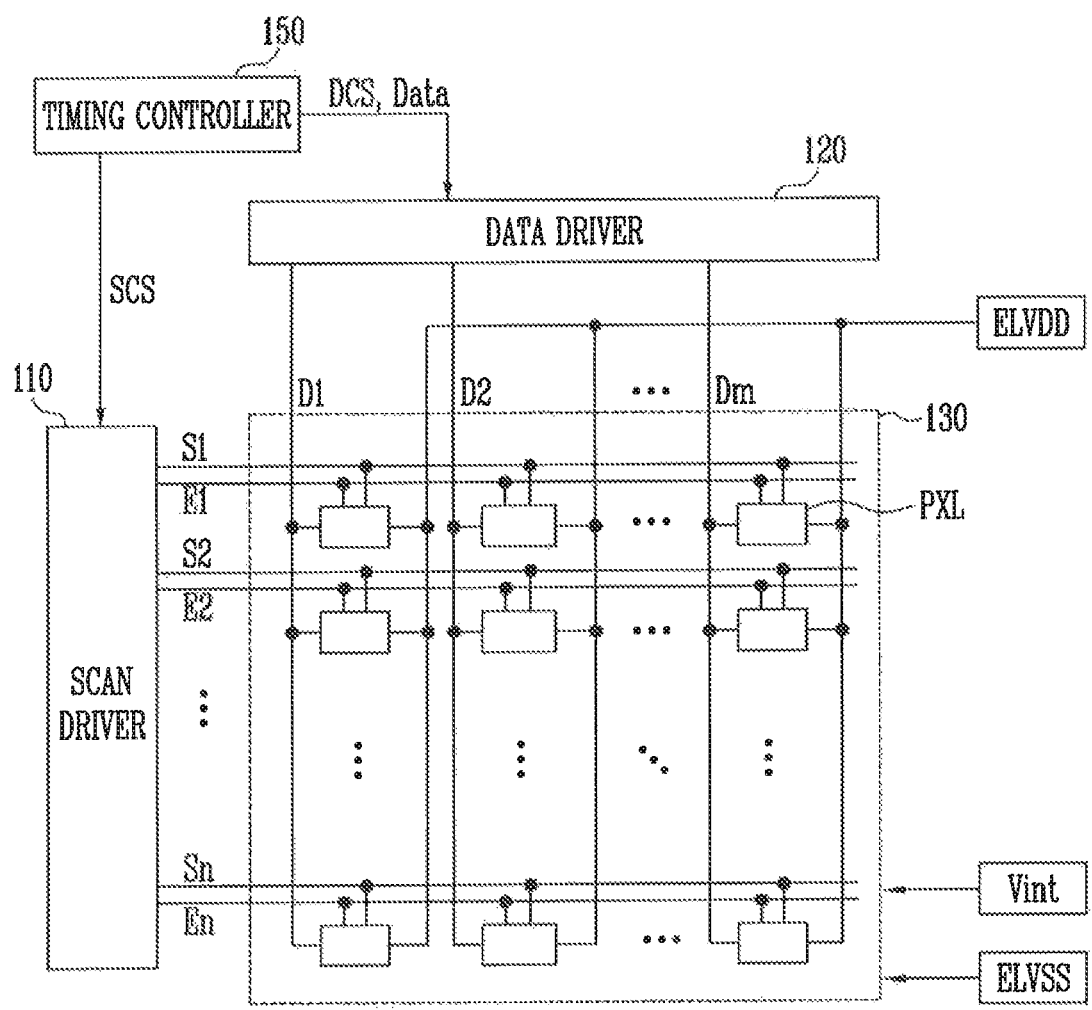
FIG. 1 illustrates a display device according to an embodiment of the present disclosure.

Exemplary embodiments will now be described more fully hereinafter with reference to the accompanying drawings; however, they may be embodied in different forms and should not be construed as limited to the embodiments set forth herein.

In the drawing figures, dimensions may be exaggerated for clarity of illustration. It will be understood that when an element is referred to as being "between" two elements, it can be the only element between the two elements, or one or more intervening elements may also be present. Like reference numerals may refer to like elements throughout.

In the drawings, the thickness of certain lines, layers, components, elements or features may be exaggerated for clarity.

It will be further understood that an expression that an element such as a layer, region, substrate or plate is placed "on" or "above" another element indicates not only a case where the element is placed "directly on" or "just above" the other element but also a case where a further element is interposed between the element and the other element. In addition, an expression that an element such as a layer, region, substrate or plate is placed "beneath" or "below" another element indicates not only a case where the element is placed "directly beneath" or "just below" the other element but also a case where a further element is interposed between the element and the other element.

Hereinafter, exemplary embodiments of the present disclosure will be described in detail with reference to the accompanying drawings.

FIG. 1 illustrates a display device according to an embodiment of the present disclosure.

Referring to FIG. 1, a display device according to an embodiment of the present disclosure includes a scan driver 110, a data driver 120, a pixel unit 130 that includes pixels PXL, and a timing controller 150.

According to an embodiment, the pixel unit 130 includes pixels PXL located in regions defined by scan lines S1 to Sn and data lines D1 to Dm. FIG. 1 shows the pixel unit 130 as including m×n pixels PXL. The pixels PXL are supplied with a first power source ELVDD and a second, external power source ELVSS. In an embodiment of the present disclosure, the second power source ELVSS has a lower voltage than the first power source ELVDD. One or more lines of pixels PXL are selected by scan signals transmitted to the scan lines S1 to Sn, and the selected pixels PXL receive a data signal. Each pixel PXL, when receiving the data signal, generates light with a luminance that corresponds to the data signal, while controlling the amount of current flowing to the second power source ELVSS from the first power source ELVDD via a light emitting device OLED. Each of the pixels PXL in the pixel unit 130 shown in FIG. 1 is a sub-pixel that is part of a unit pixel. That is, each of the pixels PXL is a sub-pixel that generates red, green, blue, or white light, but embodiments of the present disclosure are not limited thereto.

According to an embodiment, the timing controller 150 generates a data driving control signal DCS and a scan driving control signal SCS, corresponding to externally received synchronization signals. The data driving control signal DCS generated by the timing controller 150 is transmitted to the data driver 120, and the scan driving control signal SCS generated by the timing controller 150 is transmitted to the scan driver 110. In addition, the timing controller 150 realigns data that is externally received and transmits the realigned data Data to the data driver 120.

According to an embodiment, the scan driving control signal SCS includes start pulses and clock signals. The start pulses control the first timings of the scan signal and a light emitting control signal. The clock signals are used to shift the start pulses.

According to an embodiment, the data driving control signal DCS includes a source start pulse and clock signals. The source start pulse controls a sampling start point of the data signal. The clock signals are used to control a sampling operation.

According to an embodiment, the scan driver 110 receives the scan driving control signal SCS from the timing controller 150. The scan driver 110 transmits the scan signal to the scan lines S1 to Sn. For example, the scan driver 110 can sequentially transmit the scan signal to the scan lines S1 to Sn. If the scan signal is sequentially transmitted to the scan lines S1 to Sn, the pixels PXL are selected in units of horizontal lines.

According to an embodiment, the scan driver 110, after receiving the scan driving control signal SCS, transmits the light emitting control signal to light emitting control lines E1 to En. For example, the scan driver 110 can sequentially transmit the light emitting control signal to the light emitting control lines E1 to En. The light emitting control signal is used to control light emitting times of the pixels PXL. To this end, the light emitting control signal has a wider pulse than the scan signal. For example, the scan driver 110 can transmit the scan signal to an (i−1)th scan line Si−1 and an ith scan line Si, where i is a natural number, such that the scan signal overlaps the light emitting control signal transmitted to an ith light emitting control signal Ei.

According to an embodiment, the data driver 120 transmits the data signal corresponding to the data driving control signal DCS to the data lines D1 to Dm. The data signal is transmitted to the pixels PXL of the data lines D1 to Dm that were selected by the scan signal. To this end, the data driver 120 can supply the data signal to the data lines D1 to Dm such that the data signal is synchronized with the scan signal.

Figure 2:
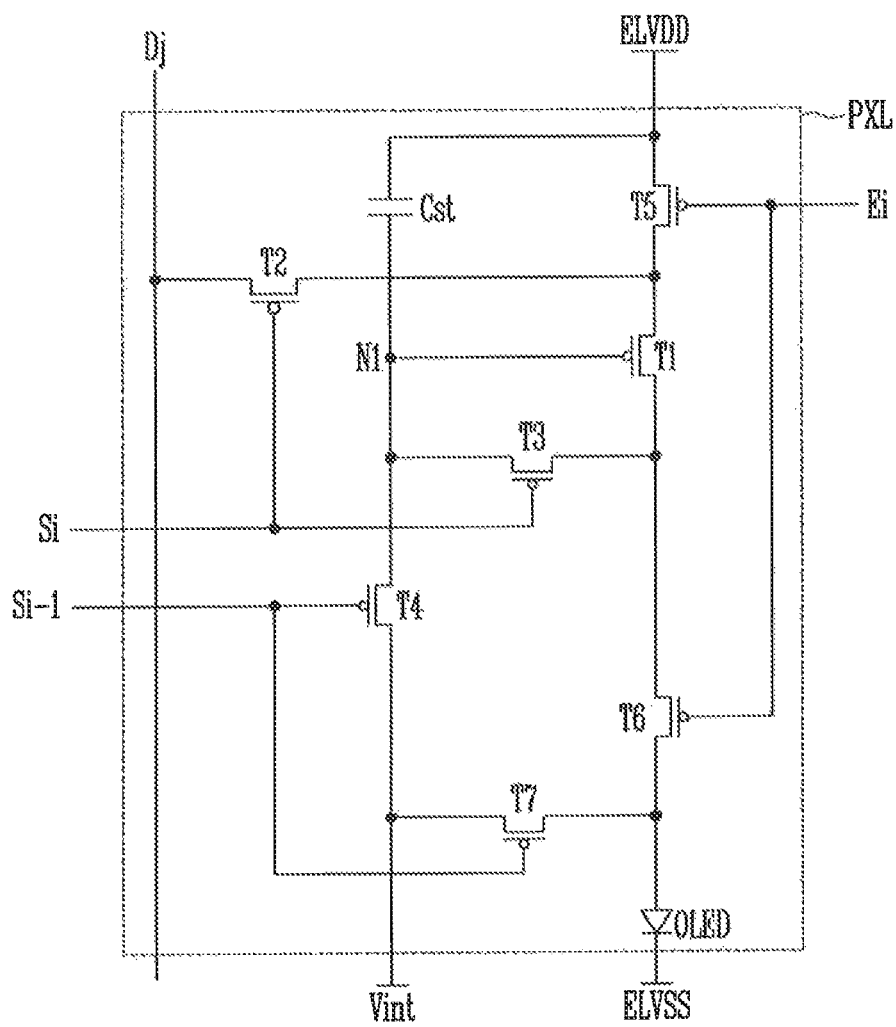
FIG. 2 is a circuit diagram that illustrates an embodiment of a pixel shown in FIG. 1.

FIG. 2 is a circuit diagram that illustrates an embodiment of the pixel shown in FIG. 1. A pixel PXL located on an ith row and a jth column, where i and j are natural numbers, is illustrated in FIG. 2.

Referring to FIGS. 1 and 2, the pixel PXL according to an embodiment of the present disclosure includes a light emitting device OLED, first to seventh transistors T1 to T7, and a storage capacitor Cst.

According to an embodiment, an anode electrode of the light emitting device OLED is connected to the first transistor T1 via the sixth transistor T6, and is connected to the second power source ELVSS. The light emitting device OLED generates light with a luminance that corresponds to the amount of current received from the first transistor T1. In this case, the first power source ELVDD is set to a higher voltage than the second power source ELVSS such that current can flow in the light emitting device OLED.

According to an embodiment, the seventh transistor T7 is connected between an initialization power source Vint and the anode electrode of the light emitting device OLED. A gate electrode of the seventh transistor T7 is connected to an (i−1)th scan line Si−1. The seventh transistor T7 is turned on when an (i−1)th scan signal is received via the (i−1)th scan line Si−1 to transmit the initialization power source Vint to the anode electrode of the light emitting device OLED. Here, the initialization power source Vint is set to a lower voltage than a data signal, but embodiments of the present disclosure are not limited thereto.

According to an embodiment, the sixth transistor T6 is located between the first transistor T1 and the light emitting device OLED and is connected to each of the first transistor T1 and the light emitting device OLED. A gate electrode of the sixth transistor T6 is connected to an ith light emitting control line Ei. The sixth transistor T6 is turned off when an ith light emitting control signal is received via the ith light emitting control line Ei, and turned on otherwise.

According to an embodiment, the fifth transistor T5 is located between the first power source ELVDD and the first transistor T1 and is connected to each of the first power source ELVDD and the first transistor T1. A gate electrode of the fifth transistor T5 is connected to the ith light emitting control line Ei. The fifth transistor T5 is turned off when the ith light emitting control signal is received via the ith light emitting control line Ei, and turned on otherwise.

According to an embodiment, a first electrode of the first transistor T1, which is a driving transistor, is connected to the first power source ELVDD via the fifth transistor T5, and a second electrode of the first transistor T1 is connected to the anode electrode of the light emitting device OLED via the sixth transistor T6. A gate electrode of the first transistor T1 is connected to a first node N1. The first transistor T1 controls the amount of current flowing from the first power source ELVDD to the second power source ELVSS via the light emitting device OLED, based on a voltage of the first node N1.

According to an embodiment, the third transistor T3 is located between the first transistor T1 and the first node N1 and is connected to each of the first transistor T1 and the first node N1. The third transistor T3 is turned on when an ith scan signal is received via an ith scan line Si, which electrically connects the second electrode of the first transistor T1 to the first node N1. Thus, the first transistor T1 can be diode-connected when the third transistor T3 is turned on.

According to an embodiment, the fourth transistor T4 is located between the first node N1 and the initialization power source Vint and is connected to each of the first node N1 and the initialization power source Vint. The fourth transistor T4 is turned on when the (i−1)th scan signal is received via the (i−1)th scan line Si−1, which transmits a voltage of the initialization power source Vint to the first node N1.

According to an embodiment, the second transistor T2, which is a switching transistor, is located between a jth data line Dj and the first transistor T1 and is connected to each of the jth data line Dj and the first electrode of the first transistor T1. In addition, the second transistor T2 is turned on when the ith scan signal is received via the ith scan line, which electrically connects the jth data line Dj to the first electrode of the first transistor T1. The second transistor T2, when turned on, performs a switching operation that transmits a data signal received from the jth data line Dj to the first electrode of the first transistor T1.

According to an embodiment, a storage capacitor Cst is located between the first power source ELVDD and the first node N1 and is connected to each of the first power source ELVDD and the first node N1. The storage capacitor Cst stores a voltage that corresponds to a jth data signal and a threshold voltage of the first transistor T1.

Figure 3:
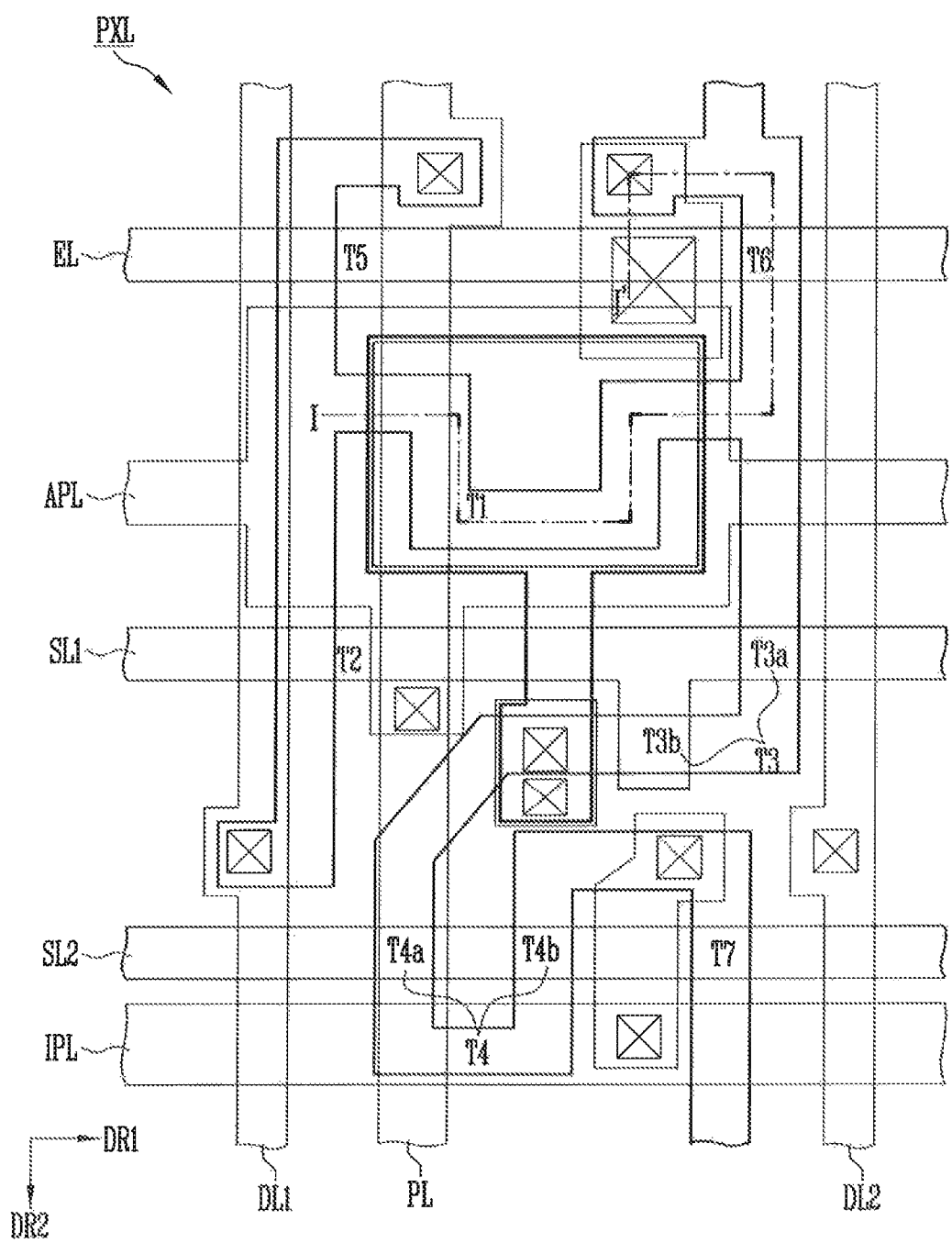
FIG. 3 is a plan view of the pixel of FIG. 2, which illustrates positions of transistors.
Figure 4:
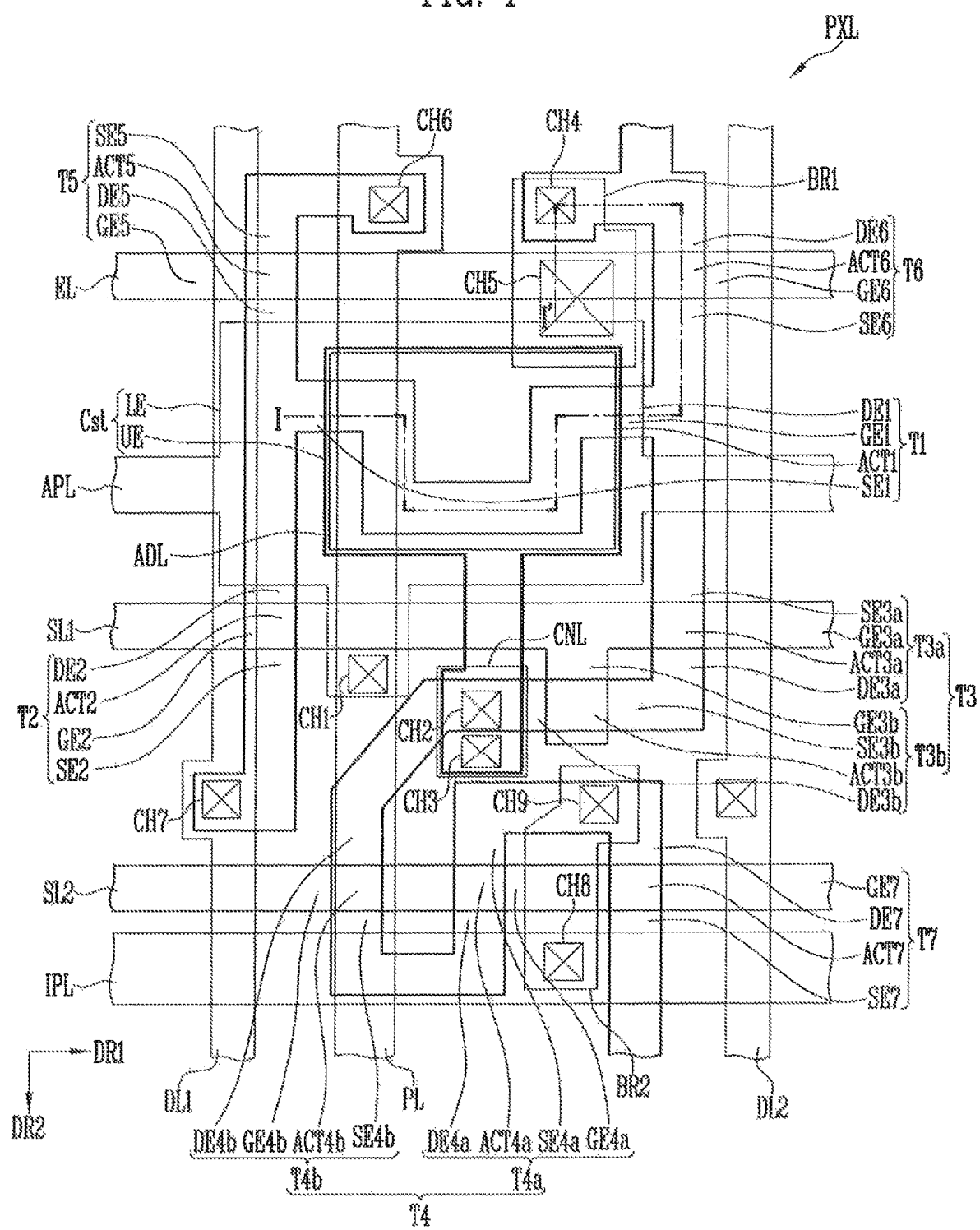
FIG. 4 is a detailed plan view of the pixel of FIG. 3.
Figure 5:
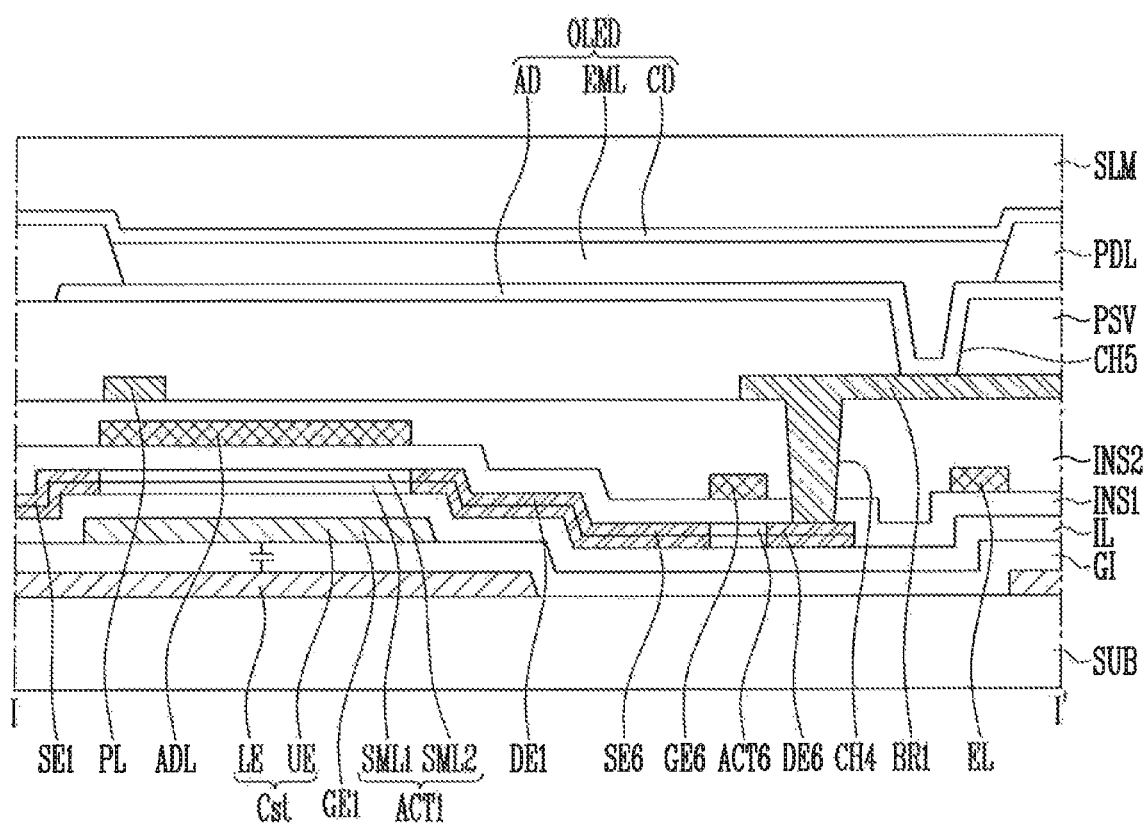
FIG. 5 is a sectional view taken along line I-I' of FIG. 4.

FIG. 3 is a plan view of the pixel of FIG. 2, which illustrates positions of transistors. FIG. 4 is a detailed plan view of the pixel of FIG. 3. FIG. 5 is a sectional view taken along line I-I' of FIG. 4. Scan lines, a light emitting control line, a power line, and data lines are illustrated in FIGS. 3 and 4. In FIGS. 3 to 5, for convenience of description, in lines provided to one pixel, one of scan lines transmitting a scan signal is designated as a "first scan line SL1," the other scan line is designated as a "second scan line SL2," a light emitting control line transmitting a light emitting control signal is designated as a "a light emitting control line EL," a data line transmitting a data signal is designated as a "data line DL1," a power line transmitting the first power source ELVDD is designated as a "power line PL," and an initialization power line transmitting the initialization power source Vint is designated as an "initialization power line IPL." Line DL2 represents a data line of an adjacent pixel.

Referring to FIGS. 2 to 5, a display device according to an embodiment of the present disclosure includes a substrate SUB, a line unit, and pixels PXL.

According to an embodiment, the substrate SUB includes an insulating material such as glass, organic polymer, or quartz. The substrate SUB is made of a flexible material that can be bent or folded. The substrate SUB may have a single-layered structure or a multi-layered structure.

According to an embodiment, for example, the substrate SUB can include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, or cellulose acetate propionate. However, embodiments are not limited thereto, and the substrate SUB may include other materials.

According to an embodiment, the line unit transmits signals to each pixel PXL, and include first and second scan lines SL1 and SL2, a data line DL1, a light emitting control line EL, a power line PL, an initialization power line IPL, and an auxiliary power line APL.

According to an embodiment, the scan lines SL1 and SL2 extend in a first direction DR1, and are sequentially disposed along a second direction DR2 that intersects the first direction DR1. Scan signals are transmitted via the scan lines SL1 and SL2. An (i−1)th scan signal is transmitted via the first scan line SL1, and an ith scan signal is transmitted via the second scan line SL2.

According to an embodiment, the light emitting control line EL extends in the first direction DR1, and is spaced part from the first scan line SL at an upper side of the first scan line SL1. A light emitting control signal is transmitted via the light emitting control line EL.

According to an embodiment, the data line DL1 extends along the second direction DR2. A data signal is transmitted via the data line DL1.

According to an embodiment, the power line PL extends along the second direction DR2, and is spaced apart from the data line DL1.

According to an embodiment, the initialization power line IPL extends along the first direction DR1, and is disposed between the second scan line SL2 and a light emitting control line EL for a pixel on a next row.

According to an embodiment, the auxiliary power line APL extends along the first direction DR1, and is disposed between the light emitting control line EL and the first scan line SL1. The first power source ELVDD is transmitted via the auxiliary power line APL together with the power line PL.

According to an embodiment, each pixel PXL includes first to seventh transistors T1 to T7, a storage capacitor Cst, a light emitting device OLED, and bridge patterns.

According to an embodiment, the first transistor T1 includes a first gate electrode GE1, a first active pattern ACT1, a first source electrode SE1, a first drain electrode DE1, and a connection line CNL.

According to an embodiment, the first gate electrode GE1 is connected to a third drain electrode DE3 of the third transistor T3 and a fourth drain electrode DE4 of the fourth transistor T4. The connection line CNL connects the first gate electrode GE to each of the third drain electrode DE3 and the fourth drain electrode DE4 through second and third contact holes CH2 and CH3.

In addition, according to an embodiment, the gate electrode GE1 extends along the second direction DR2, and is integrally formed with an upper electrode UE of the storage capacitor Cst, which will be described below. That is, the first gate electrode GE1 is disposed in the same layer as the upper electrode UE.

In an embodiment of the present disclosure, the first active pattern ACT1, the first source electrode SE1, and the first drain electrode DE1 are formed of a semiconductor layer which may be undoped or doped with impurities. The source electrode SE1 and the first drain electrode DE1 are formed of a semiconductor layer doped with impurities, and the first active pattern ACT1 is formed of an undoped semiconductor layer.

According to an embodiment, the first active pattern ACT1 is bent plural times along a direction in which the first active pattern ACT extends. The first active pattern ACT1 partially overlaps the first gate electrode GE1.

According to an embodiment, the first source electrode SE1 is connected to one end of the first active pattern ACT1, and is connected to each of a second drain electrode DE2 of the second transistor T2 and a fifth drain electrode DE5 of the fifth transistor T5. The first drain electrode DE1 is connected to the other end of the first active pattern ACT1, and is connected to each of a third source electrode SE3 of the third transistor T3 and a sixth source electrode SE6 of the sixth transistor T6.

According to an embodiment, the second transistor T2 includes a second gate electrode GE2, a second active pattern ACT2, a second source electrode SE2, and the second drain electrode DE2.

According to an embodiment, the second gate electrode GE2 is connected to the first scan line SL1. The second gate electrode GE2 is a portion of the first scan line SL1, but embodiments of the present disclosure are not limited thereto. For example, the second gate electrode GE2 can protrude from the first scan line SL1. In an embodiment of the present disclosure, the second active pattern ACT2, the second source electrode SE2, and the second drain electrode DE2 are formed of a semiconductor layer which may be undoped or doped with impurities. The source electrode SE1 and the first drain electrode DE1 are formed of a semiconductor layer doped with impurities, and the first active pattern ACT1 is formed of an undoped semiconductor layer. The second active pattern ACT2 overlaps the second gate electrode GE2. One end of the second source electrode SE2 is connected to the second active pattern ACT2, and the other end of the second source electrode SE2 is connected to the data line DL1 through a seventh contact hole CH7. One end of the second drain electrode DE2 is connected to the second active pattern ACT2, and the other end of the second drain electrode DE2 is connected to the first source electrode SE of the first transistor T1 and the fifth drain electrode DE5 of the fifth transistor T5.

According to an embodiment, the third transistor T3 has a dual gate structure to prevent leakage current. That is, the third transistor T3 includes a 3a-th transistor T3a and a 3b-th transistor T3b. The 3a-th transistor T3a includes a 3a-th gate electrode GE3a, a 3a-th active pattern ACT3a, a 3a-th source electrode SE3a, and a 3a-th drain electrode DE3a. The 3b-th transistor T3b includes a 3b-th gate electrode GE3b, a 3b-th active pattern ACT3b, a 3b-th source electrode SE3b, and a 3b-th drain electrode DE3b. Hereinafter, for convenience of description, the 3a-th gate electrode GE3a and the 3b-th gate electrode GE3b are referred to as a third gate electrode GE3, the 3a-th active pattern ACT3a and the 3b-th active pattern ACT3b are referred to as a third active pattern ACT3, the 3a-th source electrode SE3a and the 3b-th source electrode SE3b are referred to as a third source electrode SE3, and the 3a-th drain electrode DE3a and the 3b-th drain electrode DE3b are referred to as a third drain electrode DE3.

According to an embodiment, the third gate electrode GE3 is connected to the first scan line SL1. The third gate electrode GE3 can be a portion of the first scan line SL1 or can protrude from the first scan line SL1. In an embodiment of the present disclosure, the third active pattern ACT3, the third source electrode SE3, and the third drain electrode DE3 are formed of a semiconductor layer which may be undoped or doped with impurities. The third source electrode SE3 and the third drain electrode DE3 are formed of a semiconductor layer doped with impurities, and the third active pattern ACT3 is formed of an undoped semiconductor layer. The third active pattern ACT3 overlaps the third gate electrode GE3. One end of the third source electrode SE3 is connected to the third active pattern ACT3, and the other end of the third source electrode SE3 is connected to the first drain electrode DE1 of the first transistor T1 and the sixth source electrode SE6 of the sixth transistor T6. One end of the third drain electrode DE3 is connected to the third active pattern ACT3, and the other end of the third drain electrode DE3 is connected to the fourth drain electrode DE4 of the fourth transistor T4. In addition, the third drain electrode DE3 is connected to the first gate electrode GE1 of the first transistor T1 through the connection line CNL and the second and third contact holes CH2 and CH3.

According to an embodiment, the fourth transistor T4 has a dual gate structure to prevent leakage current. That is, the fourth transistor T4 includes a 4a-th transistor T4a and a 4b-th transistor T4b. The 4a-th transistor T4a includes a 4a-th gate electrode GE4a, a 4a-th active pattern ACT4a, a 4a-th source electrode SE4a, and a 4a-th drain electrode DE4a. The 4b-th transistor T4b includes a 4b-th gate electrode GE4b, a 4b-th active pattern ACT4b, a 4b-th source electrode SE4b, and a 4b-th drain electrode DE4b. Hereinafter, for convenience of description, the 4a-th gate electrode GE4a and the 4b-th gate electrode GE4b are referred to as a fourth gate electrode, the 4a-th active pattern ACT4a and the 4b-th active pattern ACT4b are referred to as a fourth active pattern, the 4a-th source electrode SE4a and the 4b-th source electrode SE4b are referred to as a fourth source electrode, and the 4a-th drain electrode DE4a and the 4b-th drain electrode DE4b are referred to as a fourth drain electrode.

According to an embodiment, the fourth gate electrode GE4 is connected to the second scan line SL2. The fourth gate electrode GE4 can be a portion of the second scan line SL2 or can protrude from the second scan line SL2. In an embodiment of the present disclosure, the fourth active pattern ACT4, the fourth source electrode SE4, and the fourth drain electrode DE4 are formed of a semiconductor layer which may be undoped or doped with impurities. The fourth source electrode SE4 and the fourth drain electrode DE4 are formed of a semiconductor layer doped with impurities, and the fourth active pattern ACT4 is formed of an undoped semiconductor layer. The fourth active pattern ACT4 overlaps the fourth gate electrode GE4. One end of the fourth source electrode SE4 is connected to the fourth active pattern ACT4, and the other end of the fourth source electrode SE4 is connected to the initialization power line IPL and a seventh drain electrode DE7 of the seventh transistor T7. A second bridge pattern BR2 is provided between the fourth source electrode SE4 and the initialization power line IPL. One end of the second bridge pattern BR2 is connected to the fourth source electrode SE4 through a ninth contact hole CH9, and the other end of the second bridge pattern BR2 is connected to the initialization power line IPL through an eighth contact hole CH8. One end of the fourth drain electrode DE4 is connected to the fourth active pattern ACT4, and the other end of the fourth drain electrode DE4 is connected to the third drain electrode DE3 of the third transistor T3. In addition, the fourth drain electrode DE4 is connected to the first gate electrode GE1 of the first transistor T1 through the connection line CNL and the second and third contact holes CH2 and CH3.

According to an embodiment, the fifth transistor T5 includes a fifth gate electrode GE5, a fifth active pattern ACT5, a fifth source electrode SE5, and the fifth drain electrode DE5.

According to an embodiment, the fifth gate electrode GE5 is connected to the light emitting control line EL. The fifth gate electrode GE5 can be a portion of the light emitting control line EL or can protrude from the light emitting control line EL. In an embodiment of the present disclosure, the fifth active pattern ACT5, the fifth source electrode SE5, and the fifth drain electrode DE5 are formed of a semiconductor layer which may be undoped or doped with impurities. The fifth source electrode SE5 and the fifth drain electrode DE5 are formed of a semiconductor layer doped with impurities, and the fifth active pattern ACT5 is formed of an undoped semiconductor. The fifth active pattern ACT5 overlaps the fifth gate electrode GE5. One end of the fifth source electrode SE5 is connected to the fifth active pattern ACT5, and the other end of the fifth source electrode SE5 is connected to the power line PL through a sixth contact hole CH6. One end of the fifth drain electrode DE5 is connected to the fifth active pattern ACT5, and the other end of the fifth drain electrode DE5 is connected to the first source electrode SE1 of the first transistor T1 and the second drain electrode DE2 of the second transistor T2.

According to an embodiment, the sixth transistor T6 includes a sixth gate electrode GE6, a sixth active pattern ACT6, the sixth source electrode SE6, and a sixth drain electrode DE6.

According to an embodiment, the sixth gate electrode GE6 is connected to the light emitting control line EL. The sixth gate electrode GE6 can be a portion of the light emitting control line EL or can protrude from the light emitting control line EL. In an embodiment of the present disclosure, the sixth active pattern ACT6, the sixth source electrode SE6, and the sixth drain electrode DE6 are formed of a semiconductor layer which may be undoped or doped with impurities. The sixth source electrode SE6 and the sixth drain electrode DE6 are formed of a semiconductor layer doped with impurities, and the sixth active pattern ACT6 is formed of an undoped semiconductor layer. The sixth active pattern ACT6 overlaps the sixth gate electrode GE6. One end of the sixth source electrode SE6 is connected to the sixth active pattern ACT6, and the other end of the sixth source electrode SE6 is connected to the first drain electrode DE1 of the first transistor T1 and the third source electrode SE3 of the third transistor T3. One end of the sixth drain electrode DE6 is connected to the sixth active pattern ACT6, and the other end of the sixth drain electrode DE6 is connected to a seventh source electrode SE7 of a seventh transistor T7 of a pixel on a previous row.

According to an embodiment, the seventh transistor T7 includes a seventh gate electrode GE7, a seventh active pattern AC7, the seventh source electrode SE7, and the seventh drain electrode DE7.

According to an embodiment, the seventh gate electrode GE7 is connected to the second scan line SL2. The seventh gate electrode GE7 can be a portion of the second scan line SL2 or can protrude from the second scan line SL2. In an embodiment of the present disclosure, the seventh active pattern ACT7, the seventh source electrode SE7, and the seventh drain electrode DE7 are formed of a semiconductor layer which may be undoped or doped with impurities. The seventh source electrode SE7 and the seventh drain electrode DE7 are formed of a semiconductor layer doped with impurities, and the seventh active pattern ACT7 is formed of an undoped semiconductor layer. One end of the seventh active pattern ACT7 overlaps the seventh gate electrode GE7. One end of the seventh source electrode SE7 is connected to the seventh active pattern ACT7, and the other end of the seventh source electrode SE7 is connected to a sixth drain electrode SE6 of a sixth transistor T6 of a pixel on a next row. One end of the seventh drain electrode DE7 is connected to the seventh active pattern ACT7, and the other end of the seventh drain electrode DE7 is connected to the initialization power line IPL. The seventh drain electrode DE7 and the initialization power line IPL are connected to each other through the second bridge pattern BR2 and the eighth and ninth contact holes CH8 and CH9.

According to an embodiment, the storage capacitor Cst includes a lower electrode LE and an upper electrode UE.

According to an embodiment, the lower electrode LE of the storage capacitor Cst is disposed in the same layer as the auxiliary power line APL, and can be part of the auxiliary power line APL. The upper electrode UE of the storage capacitor Cst can be part of the first gate electrode GE1 of the first transistor T1. The first gate electrode GE1 overlaps the auxiliary power line APL. The first gate electrode GE1 covers a portion of the auxiliary power line APL. The lower electrode LE is wider that its overlap area with the upper electrode UE, so that the capacitance of the storage capacitor Cst can be increased. According to an embodiment, the lower electrode LE of the storage capacitor Cst is a conductive pattern that is first disposed on the substrate SUB.

According to an embodiment, the light emitting device OLED includes an anode electrode AD, a cathode electrode CD, and an emitting layer EML disposed between the anode electrode AD and the cathode electrode CD.

According to an embodiment, the anode electrode AD is provided in a pixel region corresponding to each pixel PXL. The anode electrode AD is connected to the seventh drain electrode DE7 of the seventh transistor T7 and the sixth drain electrode DE6 of the sixth transistor T6 through a fourth contact hole CH4 and a fifth contact hole CH5. A first bridge pattern BR1 is disposed between the fourth contact hole CH4 and the fifth contact hole CH5 that connects the anode electrode AD to the sixth drain electrode DE6 and the seventh drain electrode DE7.

A structure of a display device according to an embodiment of the present disclosure will be described in a stacking order with reference to FIGS. 2 to 5.

First, according to an embodiment, the auxiliary power line APL, the storage capacitor Cst, the lower electrode LE, and the initialization power line IPL are disposed on the substrate SUB. The auxiliary power line APL, the lower electrode LE of the storage capacitor Cst, and the initialization power line IPL include a metallic material. The auxiliary power line APL is integrally formed with the lower electrode LE of the storage capacitor Cst.

According to an embodiment, a gate insulating layer GI is disposed over the auxiliary power line APL, the lower electrode LE of the storage capacitor Cst, and the initialization power line IPL.

According to an embodiment, the upper electrode UE of the storage capacitor Cst and the first gate electrode GE1 are disposed on the gate insulating layer GI. The first gate electrode GE1 is integrally formed with the upper electrode UE. The upper electrode UE overlaps the lower electrode LE, and the upper electrode UE and the lower electrode LE constitute the storage capacitor Cst with the gate insulating layer GI interposed therebetween.

According to an embodiment, an interlayer insulating layer IL is disposed over the upper electrode UE of the storage capacitor Cst and the first gate electrode GE1.

According to an embodiment, the first to seventh active patterns ACT1 to ACT7 are disposed on the interlayer insulating layer IL. Each of the first to seventh active patterns ACT1 to ACT7 include sequentially stacked first and second semiconductor layers SML1 and SML2 having different crystalline states. Here, the first semiconductor layer SML1 is disposed under the second semiconductor layer SML2, and has a smaller crystalline particle than the second semiconductor layer SML2.

A method according to an embodiment of forming the first semiconductor layer SML1 and the second semiconductor layer SML2 is as follows.

The first and second semiconductor layers SML1 and SML2 are formed by forming an amorphous silicon layer on the interlayer insulating layer IL on the substrate SUB and then performing a crystallization process on the amorphous silicon layer. According to an embodiment, the crystallization process may be performed through excimer laser crystallization, etc.

When the amorphous silicon layer is heated to a locally high temperature by irradiating a laser onto the amorphous silicon layer for a very short time, the amorphous silicon layer crystallizes as a polycrystalline silicon layer. If the amorphous silicon layer has a predetermined thickness, the amorphous silicon layer may be divided into the first and second semiconductor layers SML1 and SML2 having different crystalline states. Specifically, a portion of the amorphous silicon layer in direct contact with the laser becomes the second semiconductor layer SML2 having a large crystalline particle, and a portion not being in direct contact with the laser due to the second semiconductor layer SML2 becomes the first semiconductor layer SML1 having a smaller crystalline particle than the second semiconductor layer SML2. According to an embodiment, the amorphous silicon layer has a thickness of 470 Å to 550 Å. When the thickness of the amorphous silicon layer is less than 470 Å, the laser is penetrates the entire amorphous silicon layer, which is crystallized into a semiconductor layer having the same crystalline state. When the thickness of the amorphous silicon layer is greater than or equal to 550 Å, the amorphous silicon layer may not crystallize into a polycrystalline silicon layer.

According to an embodiment, the first semiconductor layer SML1 is disposed on the first gate electrode GE1 of the first transistor T1, and forms a channel region of the first transistor T1. The second semiconductor layer SML2 is disposed under the gate electrodes GE2 to GE7 of the respective second to seventh transistors T2 to T7, and forms channel regions of the respective second to seventh transistors T2 to T7. The first transistor T1, which includes the first semiconductor layer SML1 having a small crystalline particle, has a shorter channel than the second to seventh transistors T2 to T7.

According to an embodiment, a first insulating layer INS1 is disposed over the first to seventh active patterns ACT1 to ACT7, including the first and second semiconductor layers SML1 and SML2 having different crystalline states as described above.

According to an embodiment, the first scan line SL1, the second scan line SL2, the light emitting control line EL, and the second to seventh gate electrodes GE2 to GE7 are disposed on the first insulating layer INS1. The second gate electrode GE2 and the third gate electrode GE3 are integrally formed with the first scan line SL1. The fourth gate electrode GE4 and the seventh gate electrode GE7 are integrally formed with the second scan line SL1. The fifth gate electrode GE5 and the sixth gate electrode GE6 are integrally formed with the light emitting control line EL.

In addition, according to an embodiment, an anti-doping layer ADL is disposed on the first insulating layer INS1. The anti-doping layer ADL can serve as a blocking layer that prevents the first active pattern ACT1 of the first transistor T1 from being doped with impurities. Accordingly, the anti-doping layer can define a channel region of the first active pattern ACT1.

According to an embodiment, the anti-doping layer ADL is provided in the same layer as the first scan line SL1, etc. In an embodiment of the present disclosure, since the anti-doping layer ADL is provided in the same layer as the first and second scan lines SL1 and SL2, the light emitting control line EL, and the second to seventh gate electrodes GE2 to GE7, the anti-doping layer ADL includes a metallic material.

According to an embodiment, a second insulating layer INS2 is disposed over the first and second scan lines SL1 and SL2, the light emitting control line EL, the second to seventh gate electrode GE2 to GE7, and the anti-doping layer ADL.

According to an embodiment, the data line DL1, the power line PL, the first and second bridge patterns BR1 and BR2, and the connection line CNL are disposed on the second insulating layer INS2.

According to an embodiment, the data line D1 is connected to the second source electrode SE2 through the seventh contact hole CH7. In addition, the seventh contact hole CH7 penetrates the first and second insulating layers INS1 and INS2.

According to an embodiment, the power line PL is connected to the auxiliary power line APL through the first contact hole CH1. The first contact hole CH1 penetrates the gate insulating layer GI, the interlayer insulating layer IL, and the first and second insulating layers INS1 and INS2. The power line PL is also connected to the fifth source electrode SE5 through the sixth contact hole CH6. The sixth contact hole CH6 penetrates the first and second insulating layers INS1 and INS2.

According to an embodiment, the connection line CNL is connected to the third drain electrode DE3 and the fourth drain electrode DE4 through the second contact hole CH2 that penetrates the first and second insulating layers INS1 and INS2. In addition, the connection line CNL is connected to the first gate electrode GE1 through the third contact hole CH3 that penetrates the interlayer insulating layer IL and the first and second insulating layers INS1 and INS2.

According to an embodiment, the first bridge pattern BR1 is a medium that connects the sixth drain electrode DE6 to the anode electrode AD. The first bridge pattern BR1 is connected to the sixth drain electrode DE6 through the fourth contact hole CH4 that penetrates the first and second insulating layers INS1 and INS2.

According to an embodiment, the second bridge pattern BR2 is a medium that connects the fourth source electrode SE4 to the initialization power line IPL. The second bridge pattern BR2 is connected to the fourth source electrode SE4 and the seventh drain electrode DE7 through the eighth and ninth contact holes CH8 and CH9.

According to an embodiment, a protective layer PSV is disposed on the substrate SUB on which the data line D1, etc., are formed.

According to an embodiment, the anode electrode AD is disposed on the protective layer PSV. The anode electrode AD is connected to the first bridge pattern BR1 through the fifth contact hole CH5 that penetrates the protective layer PSV. Since the first bridge pattern BR1 is connected to the sixth drain electrode DE6 and the seventh source electrode SE7 through the fourth contact hole CH4, the anode electrode AD is finally connected to the sixth drain electrode DE6 and the seventh source electrode SE7.

According to an embodiment, a pixel defining layer PDL that defines a pixel region corresponding to each pixel PXL is disposed on the anode electrode AD on the substrate SUB. The pixel defining layer PDL exposes a top surface of the anode electrode AD, and protrudes from the substrate SUB along the circumference of the pixel PXL.

According to an embodiment, the emitting layer EML is disposed in the pixel region surrounded by the pixel defining layer PDL, and the cathode electrode CD is disposed on the emitting layer EML.

According to an embodiment, an encapsulation layer SLM that covers the cathode electrode CD is disposed over the cathode electrode CD.

According to an above-described embodiment, the lower electrode LE and the upper electrode UE, which are disposed under the first active pattern ACT1, serve as a light blocking layer. In the case of a transparent display device in which light is incident onto one surface of the substrate SUB, e.g., a bottom surface on which no first active pattern ACT1 is provided, the lower electrode LE and the upper electrode UE block light incident onto the bottom surface of the substrate SUB, to prevent light from penetrating toward the first active pattern ACT1.

In addition, according to an above-described embodiment, as the upper electrode UE is integrally formed with the first gate electrode GE1 of the first, driving, transistor T1, the first transistor T1 can be implemented as a bottom gate type transistor.

In addition, according to an above-described embodiment, as the first transistor T1 includes the first semiconductor layer SML1 having a small crystalline particle, the driving range of a gate voltage applied to the first gate electrode GE1 can be expanded. Accordingly, a high-resolution display device can be implemented.

In addition, according to an above-described embodiment, as the first gate electrode GE1 is disposed under the first active pattern ACT1, the interlayer insulating layer IL provided between the first gate electrode GE1 and the first active pattern ACT1 is not influenced by a projection of the first active pattern ACT1.

FIGS. 6A to 6E are layout diagrams that schematically illustrate components for each layer of the pixel shown in FIG. 4.

Figure 6A:
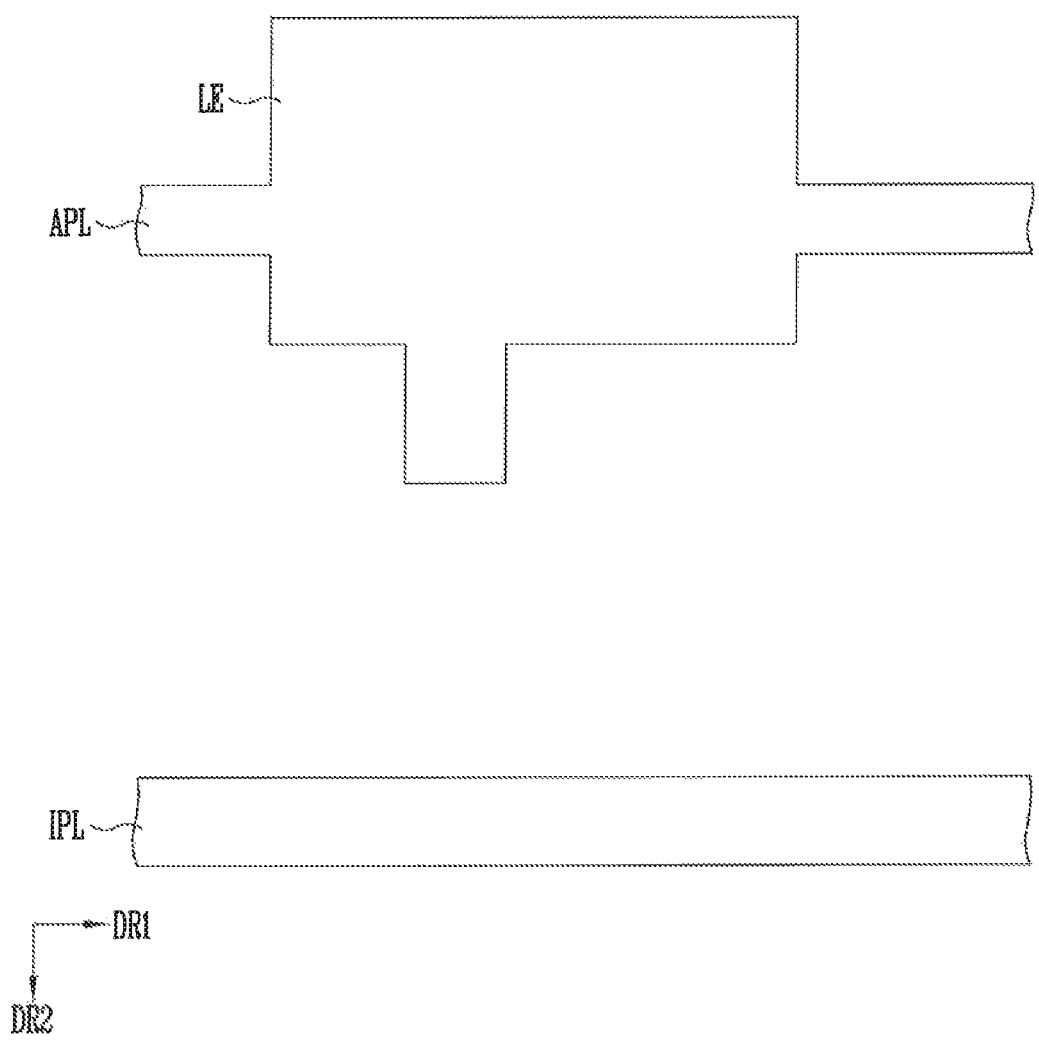
FIGS. 6A to 6E are layout diagrams that schematically illustrate components for each layer of the pixel shown in FIG. 4.

First, according to an embodiment, referring to FIGS. 4 and 6A, a lower electrode LE of a storage capacitor Cst, an auxiliary power line APL, and a initialization power line IPL are disposed on a substrate (see SUB of FIG. 5). The auxiliary power line APL and the lower electrode LE are integrally formed.

Figure 6B:
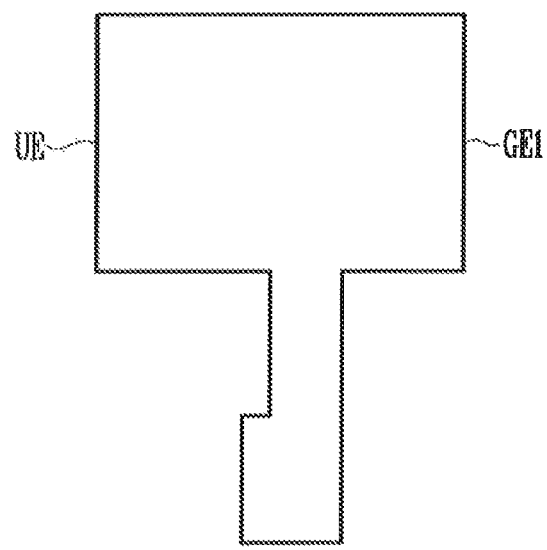
Figure 6B:
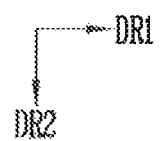

Referring to FIGS. 4 and 6B, according to an embodiment, an upper electrode UE of the storage capacitor Cst and a first gate electrode GE1 are disposed on the lower electrode LE, the auxiliary power line APL, and the initialization power line IPL with a gate insulating layer (see GI of FIG. 5) interposed therebetween.

According to an embodiment, the upper electrode UE and the first gate electrode GE1 are integrally formed. The upper electrode UE overlaps the lower electrode LE with the gate insulating layer GI interposed therebetween. The the upper electrode UE and the lower electrode LE constitute the storage capacitor Cst with the gate insulating layer GI interposed therebetween.

Figure 6C:
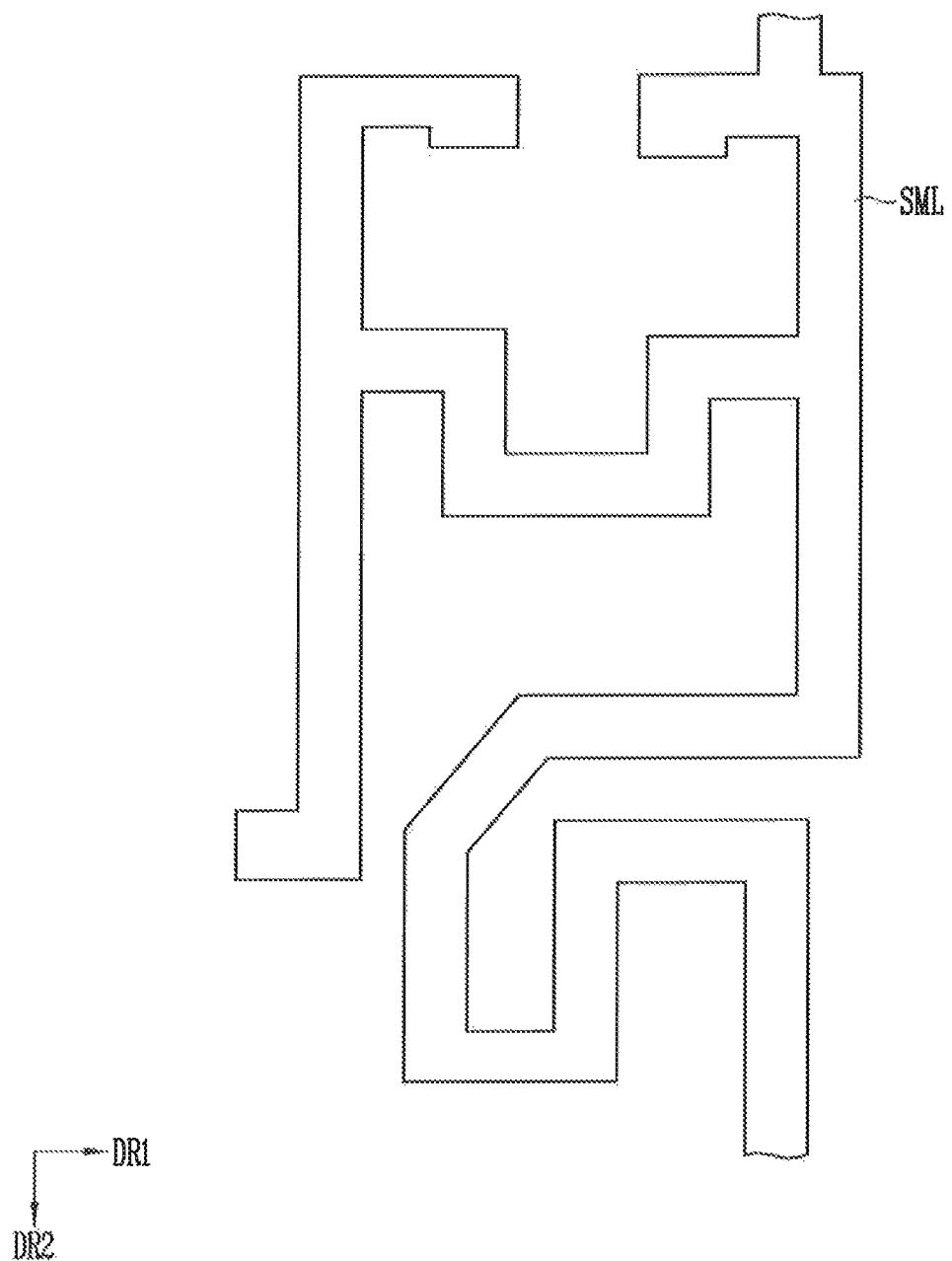

Referring to FIGS. 4 and 6C, according to an embodiment, a semiconductor layer SML that includes first to seventh active patterns ACT1 to ACT7 is disposed on the upper electrode UE and the first gate electrode GE1 with an interlayer insulating layer (see IL of FIG. 5) interposed therebetween. The semiconductor layer SML includes stacked first and second semiconductor layers (see SML1 and SML2 of FIG. 5), which have different crystalline states. The first to seventh active patterns ACT1 to ACT7 are formed from the same layer through the same process.

Figure 6D:
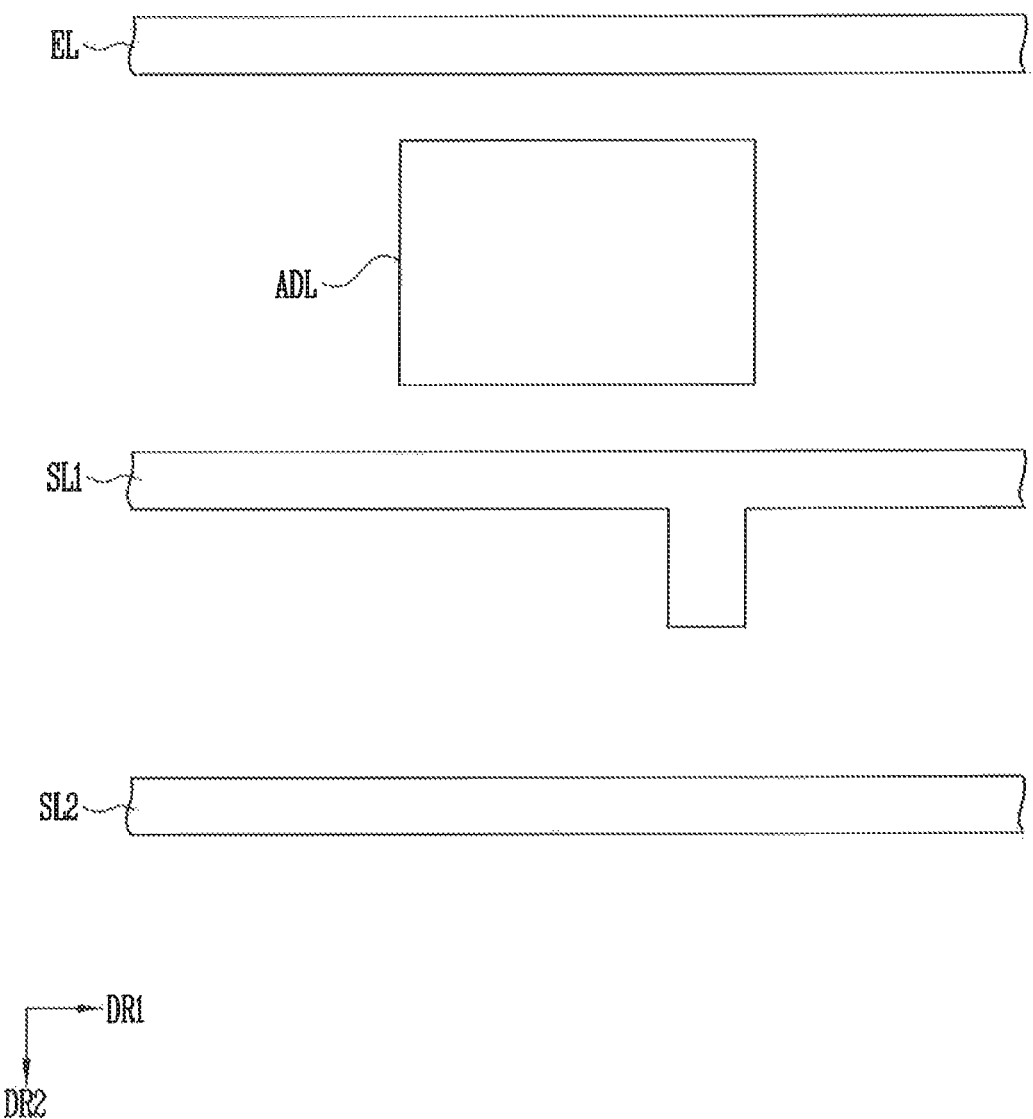

Referring to FIGS. 4 and 6D, according to an embodiment, first and second scan lines SL1 and SL2, a light emitting control line EL, and a anti-doping layer ADL are disposed on the semiconductor layer SML of FIG. 6C, with a first insulating layer (see INS1 of FIG. 5) interposed therebetween. The first and second scan lines SL1 and SL2, the light emitting control line EL, and the anti-doping layer ADL are formed from the same layer through the same process.

According to an embodiment, a second gate electrode GE2 and a third gate electrode GE3 are provided with the first scan line SL1. A fourth gate electrode GE4 and a seventh gate electrode GE7 are provided with the second scan line SL2. A fifth gate electrode GE5 and a sixth gate electrode GE6 are provided with the light emitting control line EL.

Figure 6E:
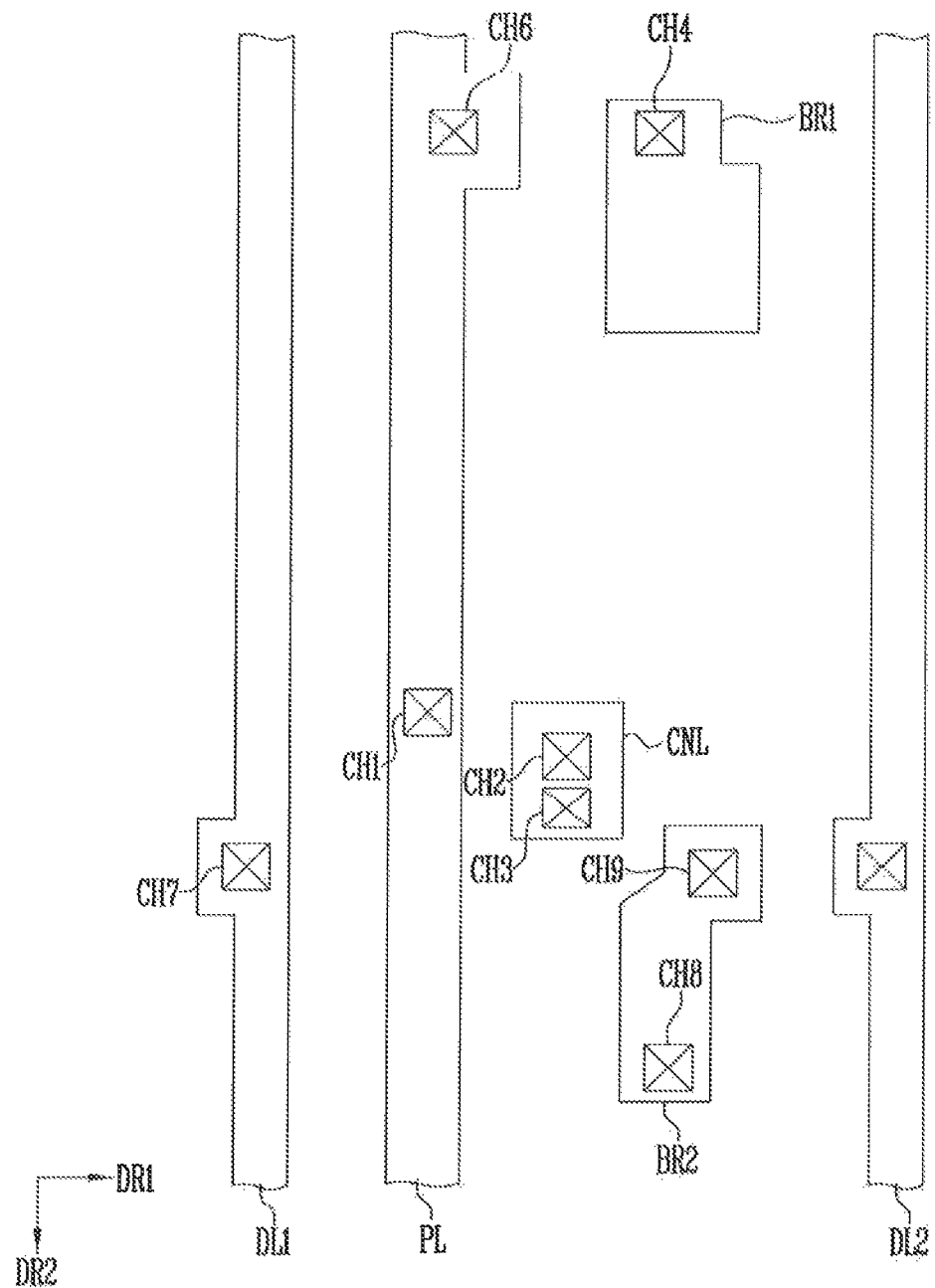

Referring to FIGS. 4 and 6E, according to an embodiment, a data line DL1, a power line PL, first and second bridge patterns BR1 and BR2, a connection line CNL are disposed on the first and second scan lines SL1 and SL2, the light emitting control line EL, and the anti-doping layer ADL with a second insulating layer (see INS2 of FIG. 5) interposed therebetween.

According to an embodiment, the data line DL1 is connected to the second source electrode SE2 through the seventh contact hole CH7 that penetrates the first and second insulating layers INS1 and INS2.

According to an embodiment, the power line PL is connected to the auxiliary power line APL through the first contact hole CH1 that penetrates the gate insulating layer GI, the interlayer insulating layer IL, and the first and second insulating layers INS1 and INS2. Also, the power line PL is connected to the fifth source electrode SE5 through the sixth contact hole CH6 that penetrates the first and second insulating layers INS1 and INS2.

According to an embodiment, the first bridge pattern BR1 is connected to the sixth drain electrode DE6 through the fourth contact hole CH4 that penetrates the first and second insulating layers INS1 and INS2. In addition, the first bridge pattern BR1 is connected to an anode electrode (see AD of FIG. 5) through the fifth contact hole CH5.

According to an embodiment, the second bridge pattern BR2 is connected to the initialization power line IPL through the eighth contact hole CH8 that penetrates the first and second insulating layers INS1 and INS2. In addition, the second bridge pattern BR2 is connected to the fourth source electrode SE4 and the seventh drain electrode DE7 through the ninth contact hole CH9 that penetrates the first and second insulating layers INS1 and INS2.

According to an embodiment, the connection line CNL is connected to the third drain electrode DE3 and the fourth drain electrode DE4 through the second contact hole CH2 that penetrates the first and second insulating layers INS1 and INS2. In addition, the connection line CNL is connected to the first gate electrode GE1 through the third contact hole CH3 that penetrates the interlayer insulating layer IL and the first and second insulating layers INS1 and INS2.

FIGS. 7A to 7F are sectional views that sequentially illustrate a method of manufacturing a pixel shown in FIG. 5.

Figure 7A:
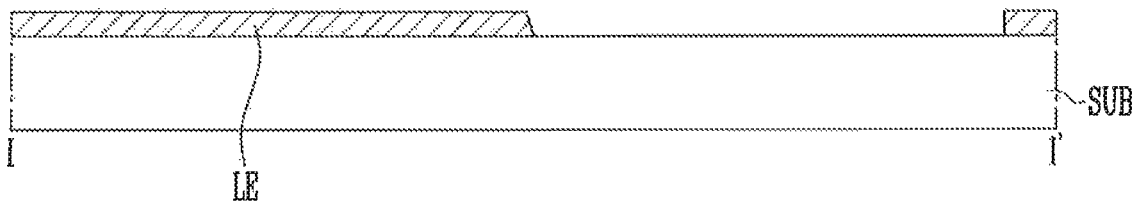
FIGS. 7A to 7F are sectional views that sequentially illustrate a method of manufacturing a pixel shown in FIG. 5.

Referring to FIGS. 5 and 7A, according to an embodiment, a conductive pattern is formed on a substrate SUB. The conductive pattern includes a lower electrode LE of a storage capacitor Cst. In addition, a buffer layer may be disposed between the substrate SUB and the lower electrode LE.

According to an embodiment, the buffer layer prevents impurities from diffusing from the substrate SUB and can improve the flatness of the substrate SUB. The buffer layer may have a single layer, or may have multiple layers that include at least two layers. The buffer layer is an inorganic insulating layer made of an inorganic material. For example, the buffer layer can be formed of silicon nitride, silicon oxide, silicon oxynitride, etc. When the buffer layer has multiple layers, the layers may be formed of the same material or may be formed of different materials. The buffer layer may be omitted depending on the materials and process conditions of the substrate SUB.

Figure 7B:
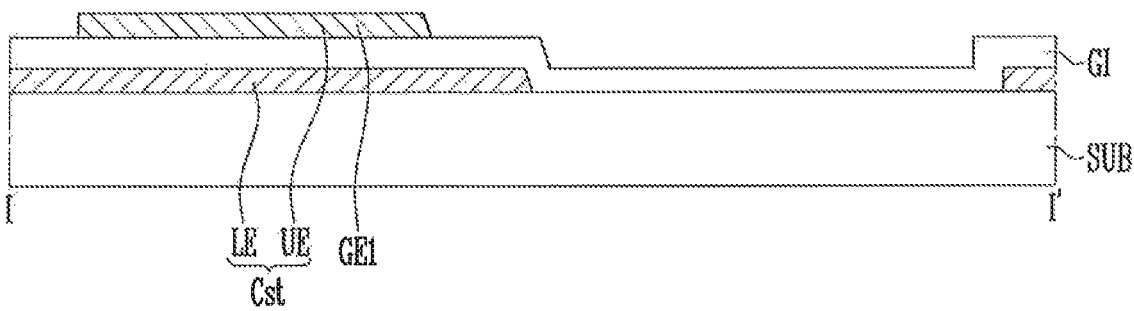

Referring to FIGS. 5 and 7B, according to an embodiment, a gate insulating layer GI is formed over the lower electrode LE.

According to an embodiment, the gate insulating layer GI may be an inorganic insulating layer made of an inorganic material. The inorganic material may be an insulating material such as silicon nitride, silicon oxide, silicon oxynitride, etc. Alternatively, the gate insulating layer GI may be an organic insulating layer made of an organic material. The organic material may be an insulating material such as a polyacryl-based compound, a polyimide-based compound, a fluorine-based compound such as polytetrafluoroethylene, a benzocyclobutene-based compound, etc.

According to an embodiment, a metal layer is formed on the gate insulating layer GI. The metal layer is an upper electrode UE of the storage capacitor Cst. The upper electrode UE is integrally formed with a first gate electrode GE1.

According to an embodiment, the upper electrode UE overlaps the lower electrode LE with the gate insulating layer GI interposed therebetween. The upper electrode UE and the lower electrode LE constitute the storage capacitor Cst with the gate insulating layer GI interposed therebetween.

Figure 7C:
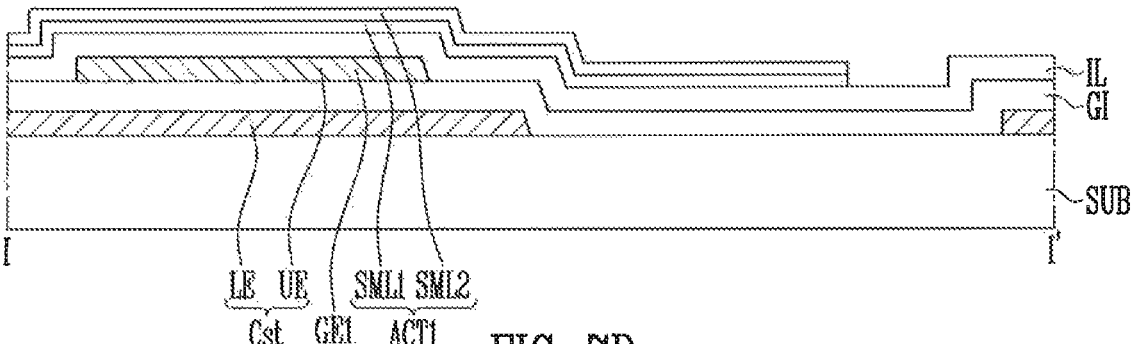

Referring to FIGS. 5 and 7C, according to an embodiment, an interlayer insulating layer IL is formed over the upper electrode UE and the first gate electrode GE1. The interlayer insulating layer IL may be an inorganic insulating layer that includes an inorganic material, but embodiments of the present disclosure are not limited thereto. For example, the interlayer insulating layer IL may be an organic insulating layer that includes an organic material.

According to an embodiment, a semiconductor layer is formed on the interlayer insulating layer IL. The semiconductor layer may be made of poly-silicon, but embodiments of the present disclosure are not limited thereto. The semiconductor layer has stacked first and second semiconductor layers SML1 and SML2, which have different crystalline states, which are formed by performing crystallization using a laser with respect to an amorphous silicon layer having a predetermined thickness.

Figure 7D:
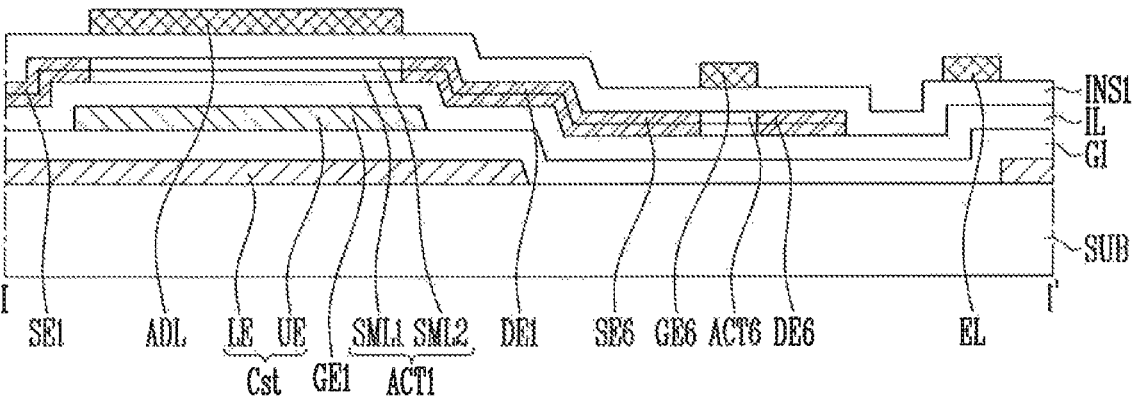

Referring to FIGS. 5 and 7D, according to an embodiment, a first insulating layer INS1 is formed on the first and second semiconductor layers SML1 and SML2 on the substrate. An insulating material of the first insulating layer INS1 can be an inorganic insulating material or an organic insulating material.

According to an embodiment, a gate pattern is formed on the first insulating layer INS1. The gate pattern includes an anti-doping layer ADL, a sixth gate electrode GE6, a light emitting control line EL, and first and second scan lines SL1 and SL2. The anti-doping layer ADL overlaps the upper electrode UE of the storage capacitor Cst.

According to an embodiment, the anti-doping layer ADL, the sixth gate electrode GE6, and the light emitting control line EL overlap the semiconductor layer.

Subsequently, according to an embodiment, impurities are doped into the substrate SUB on which the anti-doping layer ADL, the sixth gate electrode GE6, and the light emitting control line EL are formed. The semiconductor layer that overlaps the sixth gate electrode GE6 becomes an undoped sixth active pattern ACT6. In addition, the semiconductor layer that overlaps the anti-doping layer ADL becomes an undoped first active pattern ACT1.

According to an embodiment, the semiconductor layer connected to one end of the first active pattern ACT1 that does not overlap the anti-doping layer ADL becomes a first source electrode SE1. In addition, the semiconductor layer connected to the other end of the first active pattern ACT1 that does not overlap the anti-doping layer ADL becomes a first drain electrode DE1.

According to an embodiment, the semiconductor layer connected to one end of the sixth active pattern ACT6 that does not overlap the sixth gate electrode GE6 becomes a sixth source electrode SE6. In addition, the semiconductor layer connected to the other end of the sixth active pattern ACT6 that does not overlap the sixth gate electrode GE6 becomes a sixth drain electrode DE6.

Figure 7E:
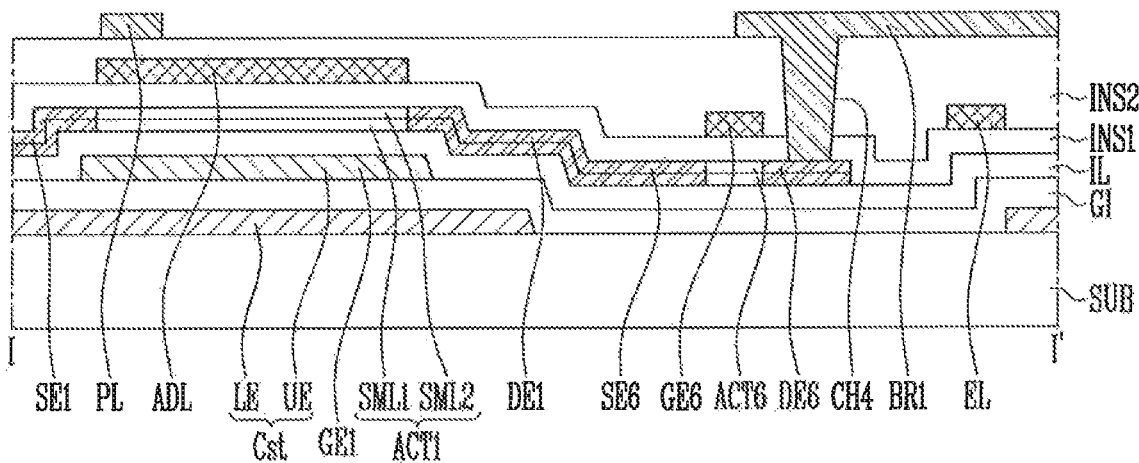

Referring to FIGS. 5 and 7E, according to an embodiment, a second insulating layer INS2 is formed on the anti-doping layer ADL, the sixth gate electrode GE6, and the light emitting control line EL on the substrate SUB. An insulating material of the second insulating layer INS2 can be an inorganic insulating material or an organic insulating material.

Subsequently, according to an embodiment, a fourth contact hole CH4 that penetrates the first and second insulating layers INS1 and INS2 is formed. Then, a data pattern is formed on the second insulating layer INS2 and the fourth contact hole CH4. The data pattern includes the power line PL, a first bridge pattern BR1, and the data line DL1. The first bridge pattern BR1 is connected to the sixth drain electrode DE6 through the fourth contact hole CH4.

Figure 7F:
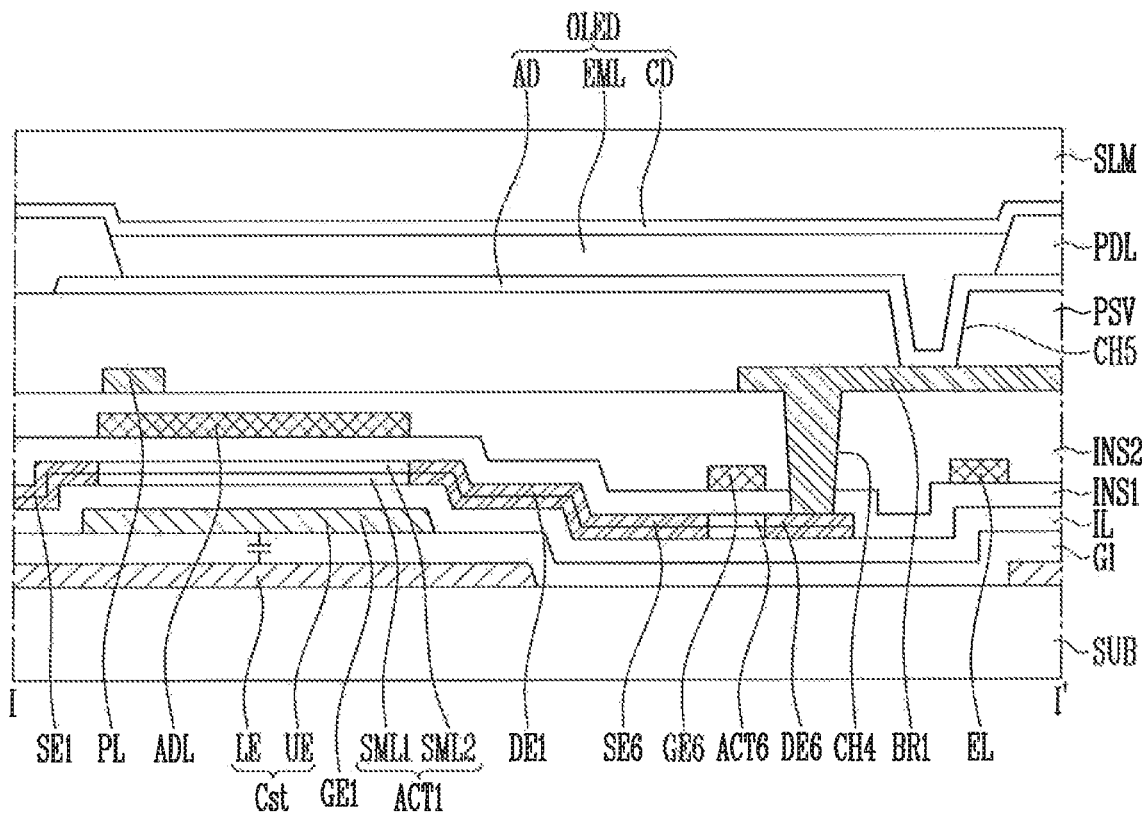

Referring to FIGS. 5 and 7F, according to an embodiment, a protective layer PSV is formed on the power line PL and the first bridge pattern BR1 on the substrate. The protective layer PSV includes a fifth contact CH5 which exposes a portion of the first bridge pattern BR1.

Then, according to an embodiment, an anode electrode AD is formed on the protective layer PSV. The anode electrode AD is electrically connected to the first bridge pattern BR1 through the fifth contact hole CH5. Subsequently, a pixel defining layer PDL is formed over the anode electrode AD.

An emitting layer EML and a cathode electrode CD are sequentially formed in a pixel region surrounded by the pixel defining layer PDL, and an encapsulation layer SLM is formed that covers the cathode electrode CD.

Figure 8:
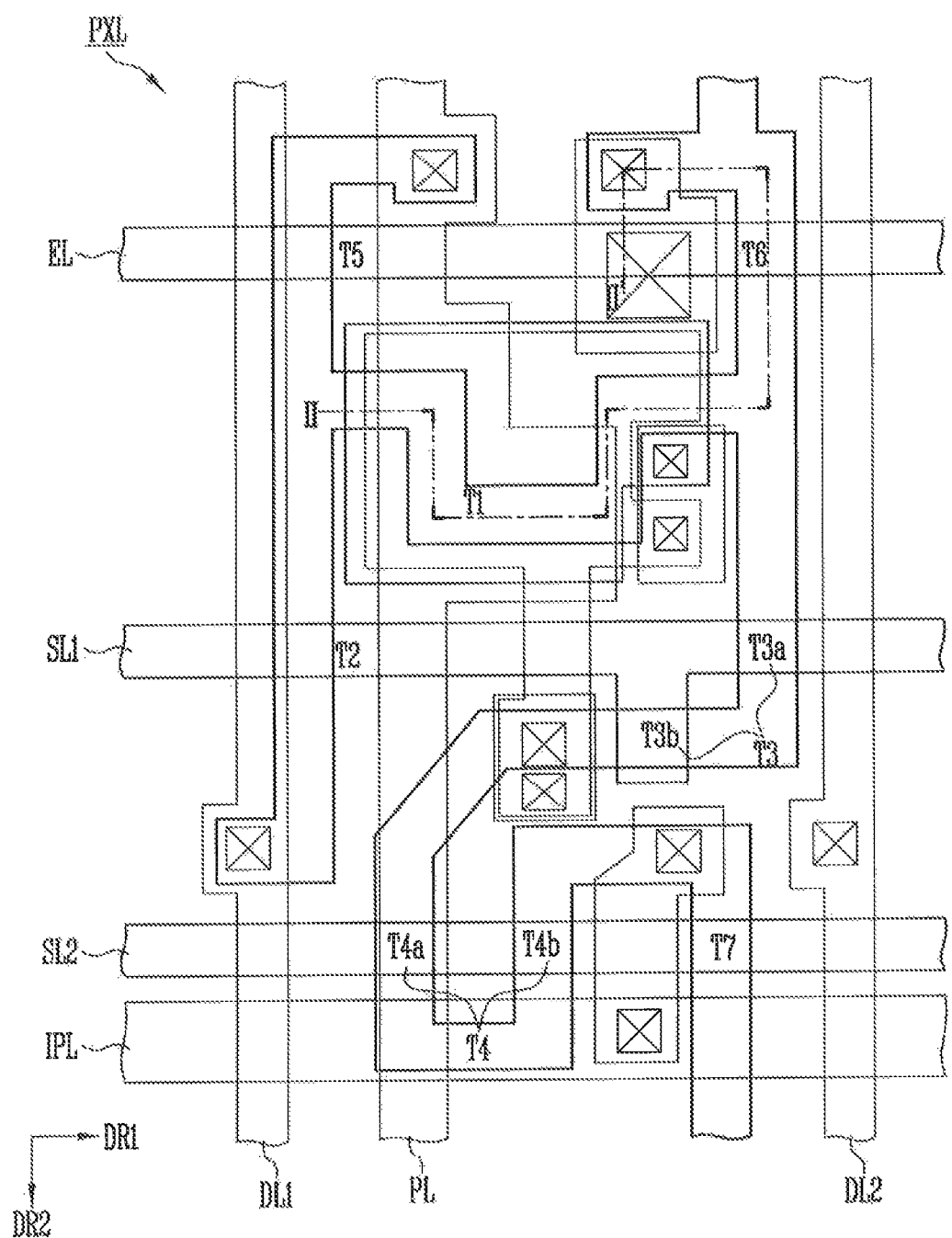
FIG. 8 is a plan view of another embodiment of a pixel of FIG. 2, which illustrates positions of transistors.
Figure 9:
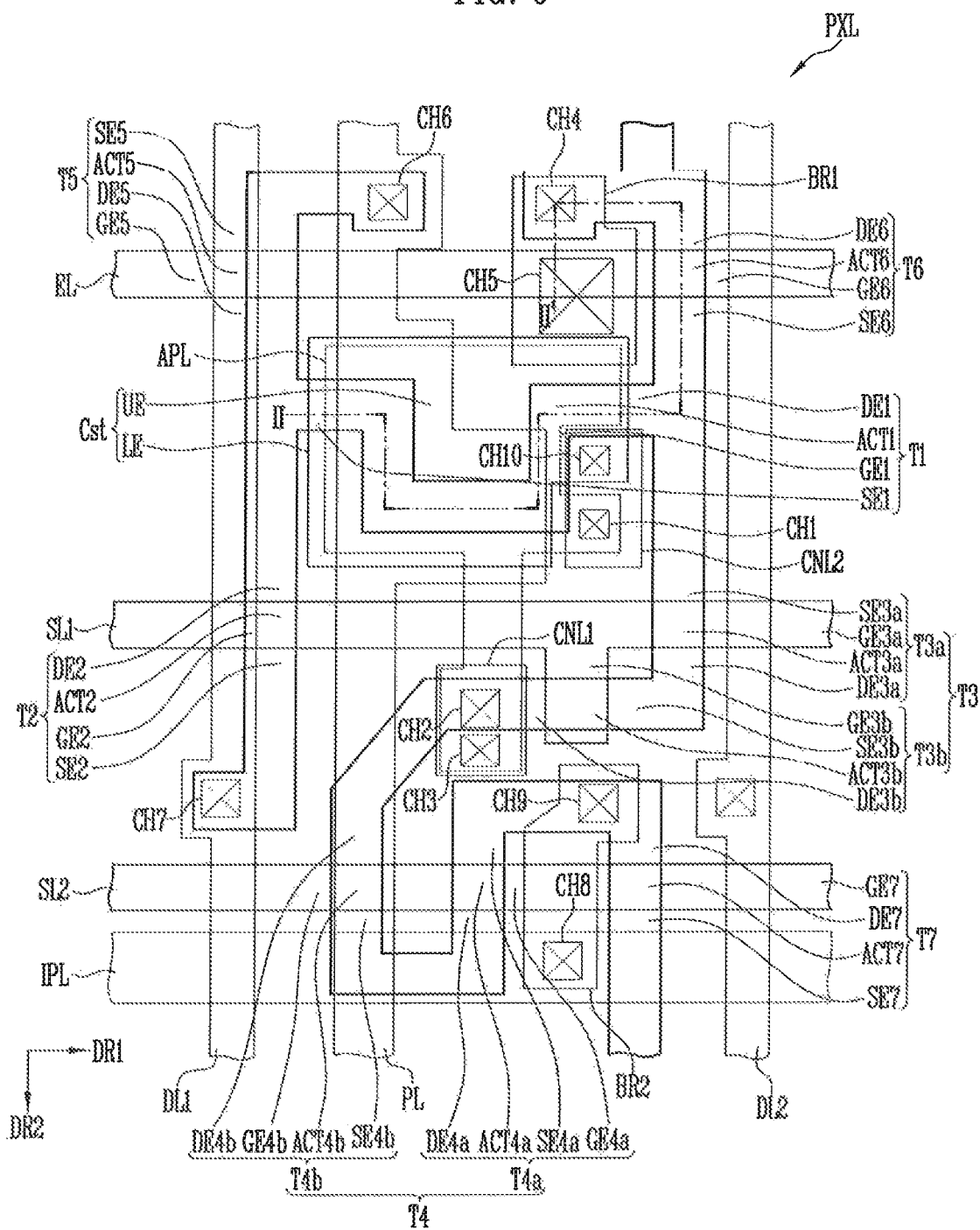
FIG. 9 is a detailed plan view of the pixel of FIG. 8.
Figure 10:
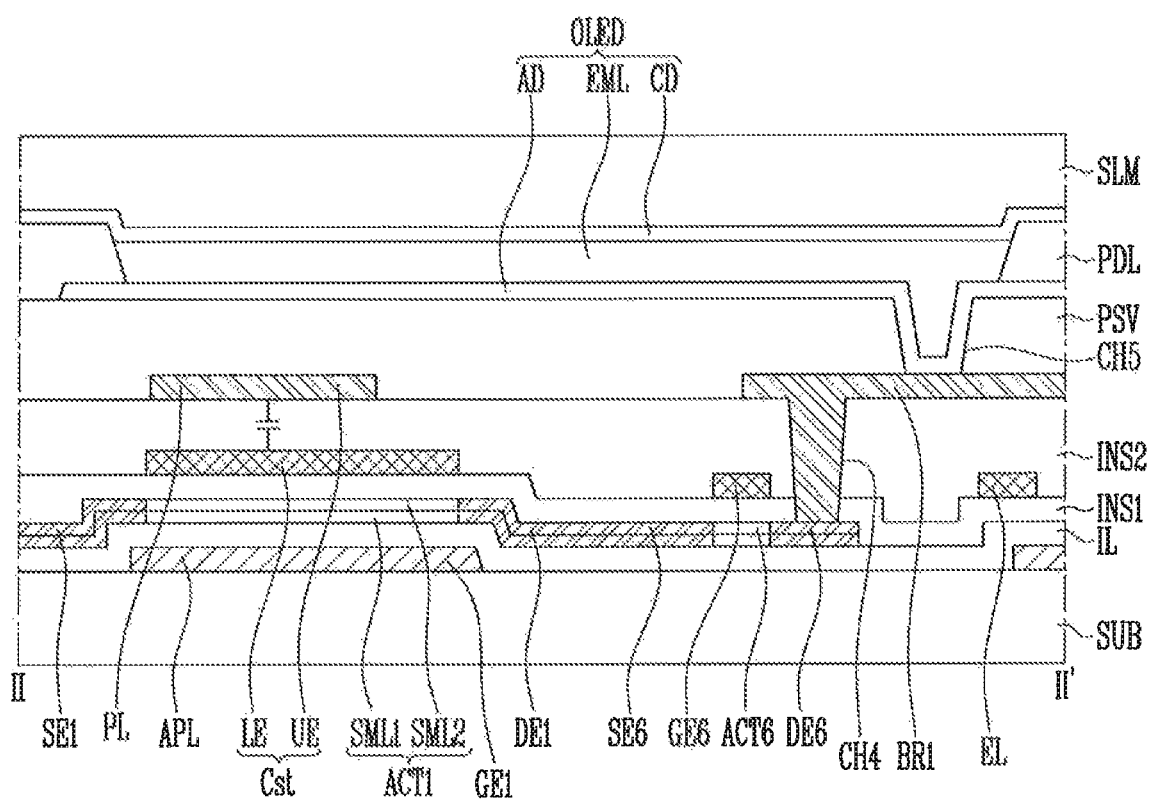
FIG. 10 is a sectional view taken along line II-II' of FIG. 9.

FIG. 8 is a plan view of another embodiment of a pixel of FIG. 2, which illustrates positions of transistors. FIG. 9 is a detailed plan view of the pixel of FIG. 8. FIG. 10 is a sectional view taken along line II-II' of FIG. 9. In a display device that includes a pixel according to another embodiment, differences from a display device according to an above-described embodiment will be mainly described to avoid redundancy. Portions of another embodiment of the present disclosure that are not described are substantially similar to those of a display device according to an above-described embodiment. In addition, identical reference numerals refer to identical components, and similar reference numerals refer to similar components.

Referring to FIGS. 2 and 8 to 10, a display device according to another embodiment of the present disclosure includes a substrate SUB, a line unit, and pixels PXL.

According to an embodiment, the line unit transmits a signal to each pixel, and includes first and second scan lines SL1 and SL2, a data line DL1, a light emitting control line EL, a power line PL, an initialization power line IPL, and an auxiliary power line APL.

According to an embodiment, the auxiliary power line APL extends along a first direction DR1, and is disposed between the light emitting control line EL and the first scan line SL1.

According to an embodiment, the power line PL extends along a second direction DR2 that intersects the first direction DR1, and is disposed on the substrate SUB and spaced apart from the data line DL1. In addition, the power line PL includes an upper electrode UE of a storage capacitor Cst that partially extends along the first direction DR1. That is, the power line PL and the upper electrode UE are integrally formed.

According to an embodiment, each pixel PXL includes first to seventh transistor T1 to T7, the storage capacitor Cst, a light emitting device OLED, and bridge patterns.

According to an embodiment, the first transistor T1 includes a first gate electrode GE1, a first active pattern ACT1, a first source electrode SE1, a first drain electrode DE1, and a first connection line CNL1.

According to an embodiment, the first source electrode SE1 is connected to a fifth drain electrode DE5 of the fifth transistor T5. The first drain electrode DE1 is connected to a sixth source electrode SE6 of the sixth transistor T6. The first gate electrode GE1 is connected to a third drain electrode DE3 of the third transistor T3 and a fourth drain electrode DE4 of the fourth transistor T4 through the first connection line CNL1. The first gate electrode GE1 is combined with the auxiliary power line APL. The first gate electrode GE1 and the auxiliary power line APL comprise a conductive pattern that is disposed on the substrate SUB.

According to an embodiment, the second transistor T2 includes a second gate electrode GE2, a second active pattern ACT2, a second source electrode SE2, and a second drain electrode DE2.

According to an embodiment, the third transistor T3 includes a 3a-th transistor T3a and a 3b-th transistor T3b. The 3a-th transistor T3a includes a 3a-th gate electrode GE3a, a 3a-th active pattern ACT3a, a 3a-th source electrode SE3a, and a 3a-th drain electrode DE3a. The 3b-th transistor T3b includes a 3b-th gate electrode GE3b, a 3b-th active pattern ACT3b, a 3b-th source electrode SE3b, and a 3b-th drain electrode DE3b.

According to an embodiment, the fourth transistor T4 includes a 4a-th transistor T4a and a 4b-th transistor T4b. The 4a-th transistor T4a includes a 4a-th gate electrode GE4a, a 4a-th active pattern ACT4a, a 4a-th source electrode SE4a, and a 4a-th drain electrode DE4a. The 4b-th transistor T4b includes a 4b-th gate electrode GE4b, a 4b-th active pattern ACT4b, a 4b-th source electrode SE4b, and a 4b-th drain electrode DE4b.

According to an embodiment, the fifth transistor T5 includes a fifth gate electrode GE5, a fifth active pattern ACT5, a fifth source electrode SE5, and the fifth drain electrode DE5.

According to an embodiment, the sixth transistor T6 includes a sixth gate electrode GE6, a sixth active pattern ACT6, the sixth source electrode SE6, and a sixth drain electrode DE6.

According to an embodiment, the seventh transistor T7 includes a seventh gate electrode GE7, a seventh active pattern ACT7, a seventh source electrode SE7, and a seventh drain electrode DE7.

According to an embodiment, the storage capacitor Cst includes a lower electrode LE and the upper electrode UE.

According to an embodiment, the upper electrode UE is combined with the power line PL. The power line PL overlaps the lower electrode LE, and covers a portion of the lower electrode LE. The lower electrode LE is wider that its overlap area with the upper electrode UE, so that the capacitance of the storage capacitor Cst can be increased.

According to an embodiment, a second connection line CNL2 is disposed between the auxiliary power line APL and the lower electrode LE. Hence, one end of the second connection line CNL2 is connected to the auxiliary power line APL through a first contact hole CH1, and the other end of the second connection line CNL2 is connected to the lower electrode LE through the tenth contact hole CH10.

According to an embodiment, the light emitting device OLED includes an anode electrode AD, a cathode electrode CD, and an emitting layer EML disposed between the anode electrode AD and the cathode electrode CD.

According to an embodiment, the anode electrode AD is disposed in a pixel region of each pixel PXL. The anode electrode AD is connected to the seventh drain electrode DE7 of the seventh transistor T7 and the sixth drain electrode DE6 of the sixth transistor T6 through a fourth contact hole CH4 and a fifth contact hole CH5. A first bridge pattern BR1 is disposed between the fourth contact hole CH4 and the fifth contact hole CH5 and connects the anode electrode AD to the sixth drain electrode DE6 and the seventh drain electrode DE7.

A structure of the display device according to another embodiment of the present disclosure will be described in a stacking order with reference to FIGS. 8 to 10.

First, according to an embodiment, the auxiliary power line APL, the initialization power line IPL, and the first gate electrode GE1 are disposed on the substrate SUB. The auxiliary power line APL is integrally formed with the first gate electrode GE1.

According to an embodiment, an interlayer insulating layer IL is disposed over the auxiliary power line APL, the initialization power line IPL, and the first gate electrode GE1.

According to an embodiment, the first to seventh active patterns ACT1 to ACT7 are disposed on the interlayer insulating layer IL. Each of the first to seventh active patterns ACT1 to ACT7 comprises two sequentially stacked semiconductor layers, a first semiconductor layer SML1 and a second semiconductor layer SML2, which have different crystalline states. According to an embodiment, the first semiconductor layer SML1 is disposed under the second semiconductor layer SML2, and has a smaller crystalline particle than the second semiconductor layer SML2.

According to an embodiment, the first semiconductor layer SML1 is disposed on the first gate electrode GE1 of the first transistor T1, and forms a channel region of the first transistor T1.

According to an embodiment, a first insulating layer INS is disposed over the first to seventh active patterns ACT1 to ACT7 that include the first and second semiconductor layers SML1 and SML2.

According to an embodiment, the lower electrode LE, the first and second scan lines SL1 and SL2, the light emitting control line EL, and the second to seventh gate electrodes GE2 to GE7 are disposed on the first insulating layer INS1. The second semiconductor layer SML2 is disposed under each of the second to seventh gate electrodes GE2 to GE7, and forms a channel region of each of the second to seventh transistors T2 to T7. Therefore, the first transistor T1, which includes the first semiconductor layer SML1 having a small crystalline particle, has a shorter channel than the second to seventh transistors T2 to T7.

According to an embodiment, the lower electrode LE is a lower electrode of the storage capacitor Cst and, being disposed on the first active pattern ACT1, functions as an anti-doping layer that prevents the first active pattern ACT1 from being doped with impurities. Accordingly, the lower electrode LE defines a channel region of the first active pattern ACT1.

According to an embodiment, a second insulating layer INS2 is disposed on the lower electrode LE, the first and second scan lines SL1 and SL2, the light emitting control line EL, and the second to seventh gate electrodes GE2 to GE7 on the substrate.

According to an embodiment, the data line DL1, the power line PL, the first and second bridge patterns BR1 and BR2, and the first and second connection lines CNL1 and CNL2 are disposed on the second insulating layer INS2. In addition, the upper electrode UE of the storage capacitor Cst, which is integrally formed with the power line PL, is disposed on the second insulating layer INS2.

According to an embodiment, a protective layer PSV is disposed on the data line DL1, the power line PL, the first and second bridge patterns BR1 and BR2, and the first and second connection lines CNL1 and CNL2.

According to an embodiment, the anode electrode AD is disposed on the protective layer PSV. The anode electrode AD is connected to the first bridge pattern BR1 through the fifth contact hole CH5 that penetrates the protective layer PSV. The anode electrode AD is connected to the sixth drain electrode DE6 and the seventh source electrode SE7 via the first bridge pattern BR1.

According to an embodiment, a pixel defining layer PDL is disposed on the anode electrode AD. The emitting layer EML is provided in a pixel region surrounded by the pixel defining layer PDL. The cathode electrode CD is disposed on the emitting layer EML.

According to an embodiment, an encapsulation layer SLM covering the cathode electrode CD is disposed over the cathode electrode CD.

FIGS. 11A to 11D are layout diagrams that schematically illustrate components of each layer of a pixel shown in FIG. 9.

Figure 11A:
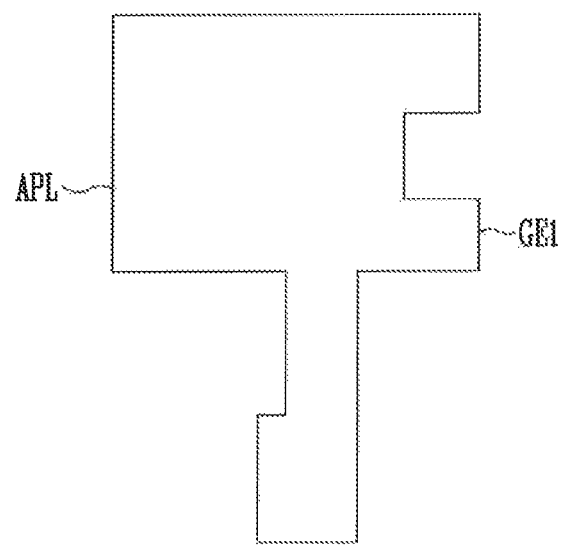
FIGS. 11A to 11D are layout diagrams that schematically illustrate components of each layer for a pixel shown in FIG. 9.
Figure 11A:
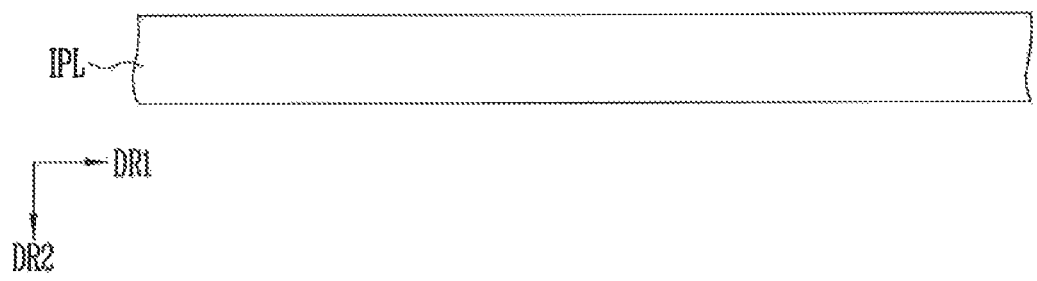

First, according to an embodiment, referring to FIGS. 9 and 11A, according to an embodiment, a conductive pattern is disposed on the substrate (see SUB of FIG. 10). The conductive pattern includes the auxiliary power line APL, the initialization power line IPL, and the first gate electrode GE1. The auxiliary power line APL and the first gate electrode GE1 are integrally formed.

Figure 11B:
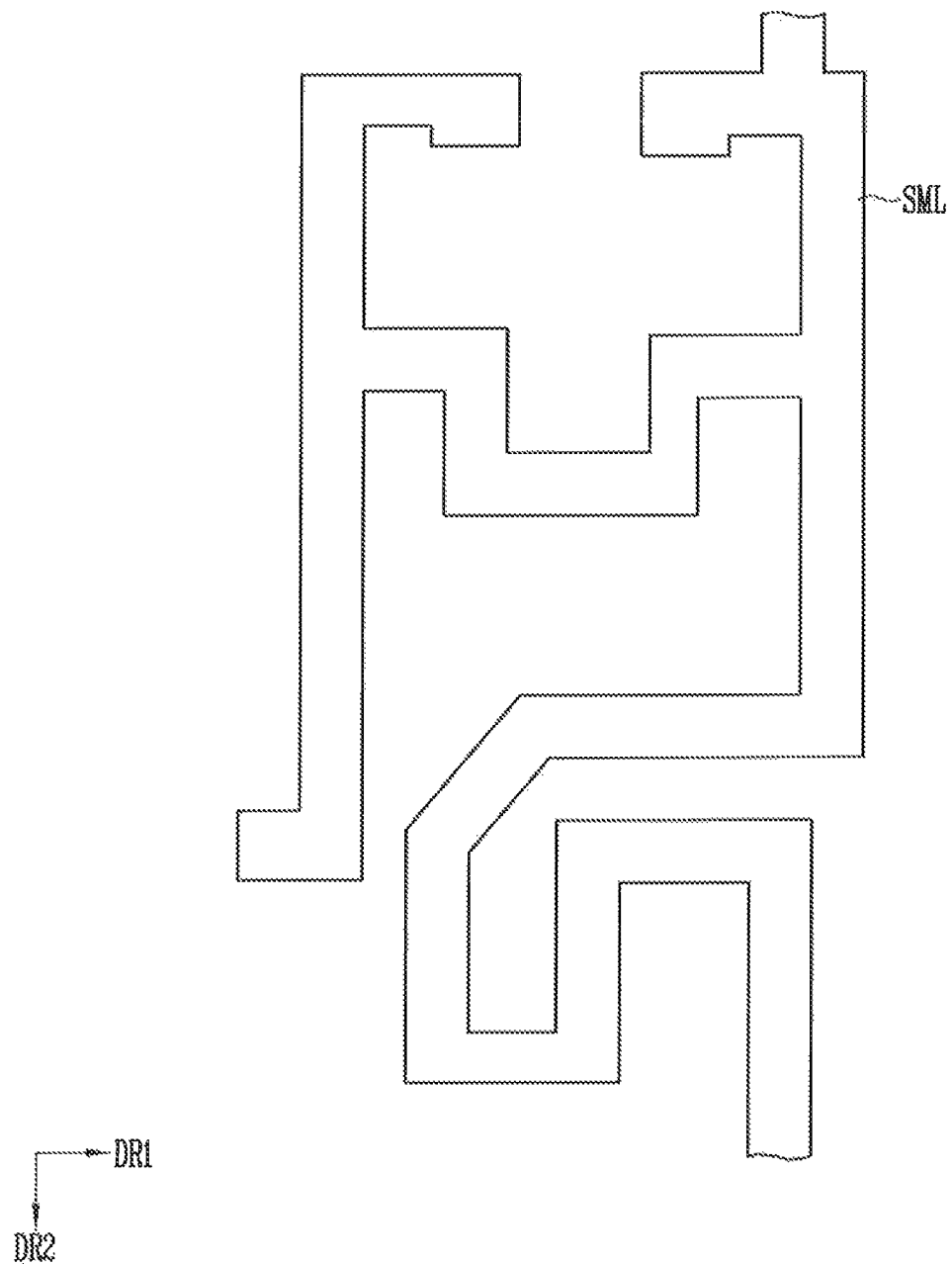

Referring to FIGS. 9 and 11B, according to an embodiment, a semiconductor layer SML that includes the first to seventh active patterns ACT1 to ACT7 is disposed on the auxiliary power line APL, the initialization power line IPL, and the first gate electrode GE1 with the interlayer insulating layer (see IL of FIG. 10) interposed therebetween. The semiconductor layer SML includes stacked first and second semiconductor layers (see SML1 and SML2 of FIG. 10), which have different crystalline states. The first to seventh active patterns ACT1 to ACT7 are formed from the same layer through the same process.

Figure 11C:
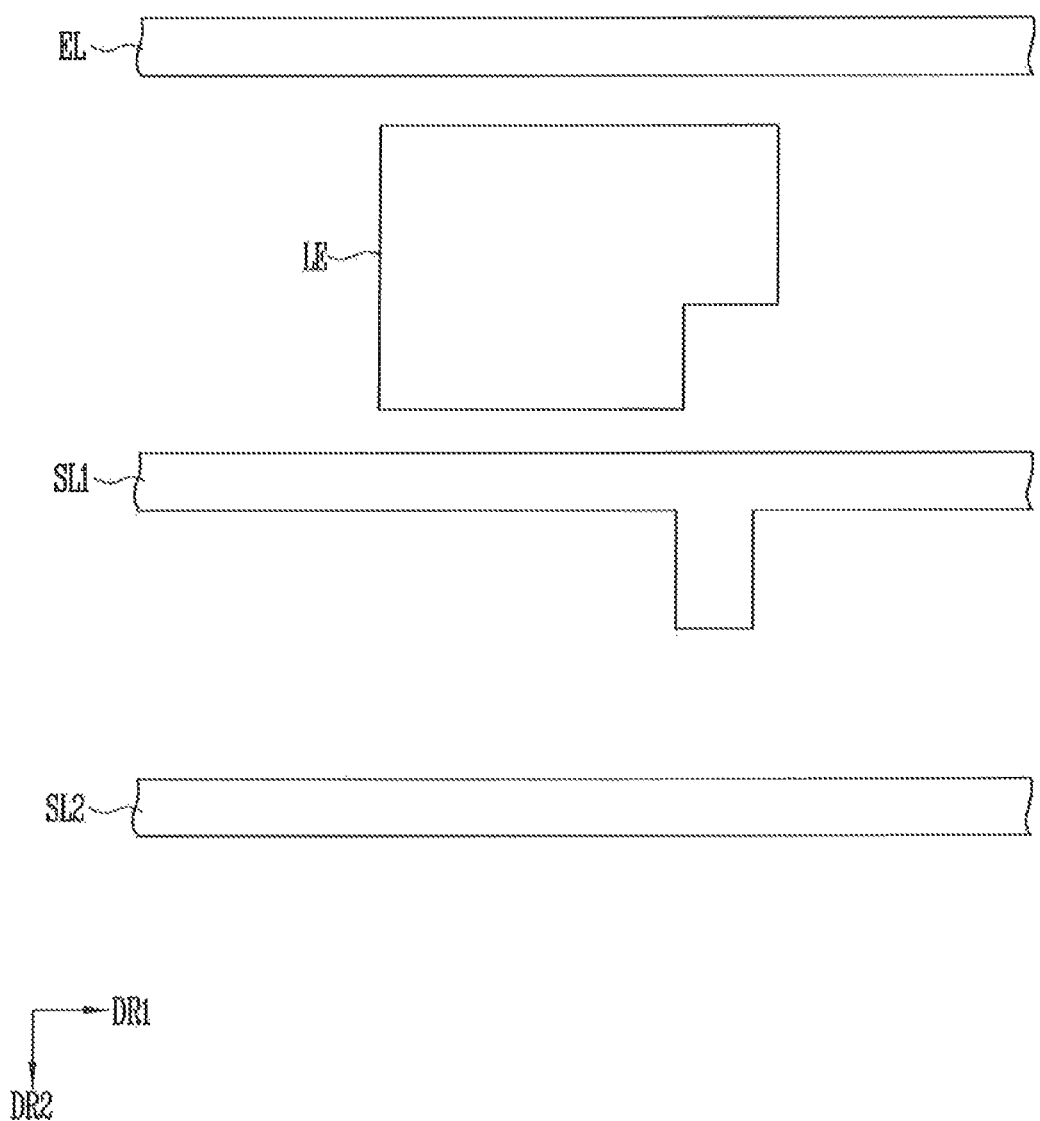

Referring to FIGS. 9 and 11C, according to an embodiment, the first and second scan lines SL1 and SL2, the light emitting control line EL, and the lower electrode LE of the storage capacitor Cst are disposed on the semiconductor layer SML with the first insulating layer (see INS1 of FIG. 10) interposed therebetween. The first and second scan lines SL1 and SL2, the light emitting control line EL, and the lower electrode LE are formed from the same layer through the same process.

According to an embodiment, the second gate electrode GE2 and the third gate electrode GE3 are provided with the first scan line SL1. The fourth gate electrode GE4 and the seventh gate electrode GE7 are provided with the second scan line SL2. The fifth gate electrode GE5 and the sixth gate electrode GE6 are provided with the light emitting control line EL.

Figure 11D:
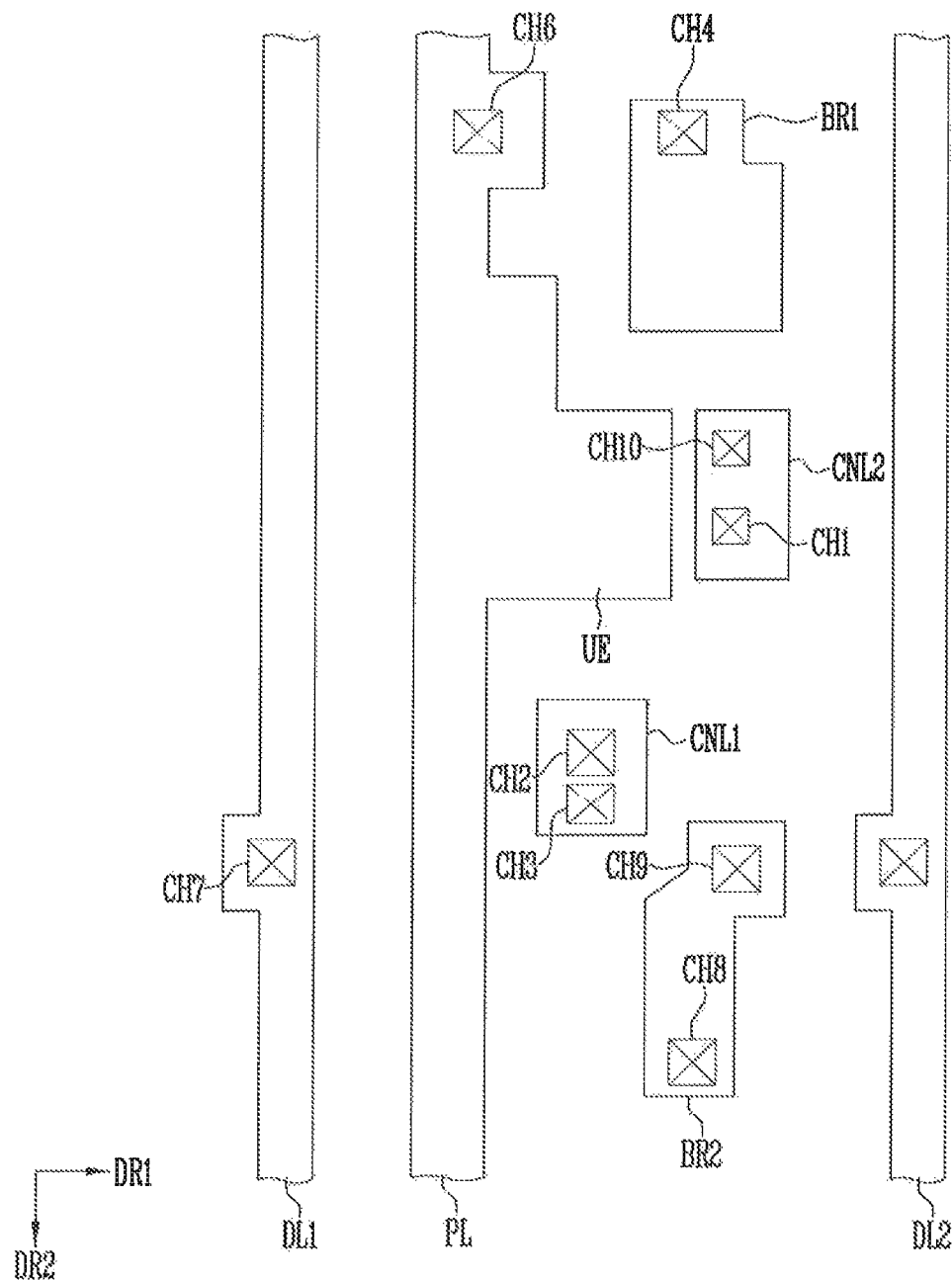

Referring to FIGS. 9 and 11D, according to an embodiment, the data line DL1, the power line PL, the first and second bridge patterns BR1 and BR2, the first and second connection lines CNL1 and CNL2, and the upper electrode UE of the storage capacitor Cst are provided on the first and second scan lines SL1 and SL2, the light emitting control line EL, and the lower electrode LE with the second insulating layer (see INS2 of FIG. 10) interposed therebetween.

According to an embodiment, the data line DL1 is connected to the second source electrode SE2 through the seventh contact hole CH7 that penetrates the first and second insulating layers INS1 and INS2.

According to an embodiment, the power line PL is connected to the fifth source electrode SE5 through the sixth contact hole CH6 that penetrates the first and second insulating layers INS1 and INS2.

According to an embodiment, the first bridge pattern BR1 is connected to the sixth drain electrode DE6 through the fourth contact hole CH4 that penetrates the first and second insulating layers INS1 and INS2. In addition, the first bridge pattern BR1 is connected to the anode electrode (see AD of FIG. 10) through the fifth contact hole CH5.

According to an embodiment, the second bridge pattern BR2 is connected to the initialization power line IPL through the eighth contact hole CH8 that penetrates the first and second insulating layers INS1 and INS2. In addition, the second bridge pattern BR2 is connected to the fourth source electrode SE4 and the seventh drain electrode DE7 through the ninth contact hole CH9 that penetrates the first and second insulating layers INS1 and INS2.

According to an embodiment, the first connection line CNL1 is connected to the third drain electrode DE3 and the fourth drain electrode DE4 through the second contact hole CH2 that penetrates the first and second insulating layers INS1 and INS2. In addition, the first connection line CNL1 is connected to the first gate electrode GE1 through the third contact hole CH3 that penetrates the interlayer insulating layer IL and the first and second insulating layers INS1 and INS2.

According to an embodiment, the second connection line CNL2 is connected to the auxiliary power line APL through the first contact hole CH1 that penetrates the interlayer insulating layer IL and the first and second insulating layers INS1 and INS2. In addition, the second connection line CNL2 is connected to the lower electrode LE through the tenth contact hole CH10 that penetrates the first and second insulating layers INS1 and INS2.

According to an embodiment, the upper electrode UE of the storage capacitor Cst is integrally formed with the power line PL. The upper electrode UE overlaps the lower electrode LE with the second insulating layer INS2 interposed therebetween, to constitute the storage capacitor Cst.

A display device according to embodiments of the present disclosure can be incorporated into various electronic devices. For example, a display device can be incorporated into televisions, notebook computers, cellular phones, smart phones, smart pads, PMPs, PDAs, navigations, various wearable devices such as smart watches, etc.

According to embodiments of the present disclosure, it is possible to provide a display device capable of implementing high resolution.

According to embodiments of the present disclosure, it is possible to provide a method of manufacturing the display device.

Exemplary embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A display device comprising:
   a scan line that extends in a first direction on a substrate, wherein the scan line transmits a scan signal;
   a data line that extends in a second direction that intersects the first direction, wherein the data line transmits a data signal;
   a driving voltage line that extends in the second direction, wherein the driving voltage line transmits a driving voltage;
   a second transistor connected to the scan line and the data line;
   a first transistor connected to the second transistor;
   a light emitting device connected to the first transistor;
   a first conductive pattern disposed on-the substrate; and
   a second conductive pattern disposed on the first transistor and provided on the same layer as the scan line,
   wherein each of the first and second transistors includes an active pattern with a stacked first semiconductor layer and a second semiconductor layer, which have different crystalline states,
   wherein the first conductive pattern is disposed under the active pattern of the first transistor with an insulating layer interposed therebetween, and
   wherein the second conductive pattern is disposed on the active pattern of the first transistor and overlaps at least a portion of the active pattern of the first transistor.

2. The display device of claim 1, wherein the first semiconductor layer is disposed under the second semiconductor layer and has a smaller crystalline particle than the second semiconductor layer.

3. The display device of claim 1, further comprising a storage capacitor between the substrate and the first semiconductor layer, wherein the storage capacitor includes the first conductive pattern, a metal layer that overlaps the first conductive pattern, and the insulating layer interposed therebetween.

4. The display device of claim 1, wherein the first conductive pattern is a light blocking layer that blocks light incident into a bottom surface of the substrate.

5. The display device of claim 1, further comprising an auxiliary power line integrally formed with the conductive pattern, and an initialization power line that extends in the first direction.

6. The display device of claim 3, wherein the first transistor includes:
   a gate electrode integrally formed with the metal layer;
   the active pattern disposed on the gate electrode; and
   source and drain electrodes each connected to respective ends of the active pattern.

7. The display device of claim 1, further comprising a storage capacitor that includes a lower electrode disposed on the active pattern, an upper electrode that overlaps the lower electrode, and an interlayer insulating layer interposed therebetween,
   wherein the interlayer insulating layer is disposed on the insulating layer.

8. The display device of claim 7, wherein the upper electrode is integrally formed with the driving voltage line, and the lower electrode is integrally formed with the second conductive pattern.

9. The display device of claim 7, wherein the first transistor includes:
   a gate electrode integrally formed with the conductive pattern;
   the active pattern disposed on the gate electrode; and
   source and drain electrodes each connected to respective ends of the active pattern.

10. A display device comprising:
a second transistor on a substrate that is connected to a scan line and a data line;
a first transistor on the substrate that is connected to the second transistor;
a light emitting device connected to the first transistor;
a first conductive pattern disposed on the substrate;
a second conductive pattern disposed on the first transistor and provided on the same layer as the scan line,
wherein each of the first and second transistors includes an active pattern with a stacked first semiconductor layer and a second semiconductor layer, which have different crystalline states,
wherein the first semiconductor layer is disposed under the second semiconductor layer and has a smaller crystalline particle than the second semiconductor layer, and
wherein the first conductive pattern is a light blocking layer that blocks light incident into a bottom surface of the substrate,
wherein the first conductive pattern is disposed under the active pattern of the first transistor with an insulating layer interposed therebetween, and
wherein the second conductive pattern is disposed on the active pattern of the first transistor and overlaps at least a portion of the active pattern of the first transistor.

11. The display device of claim 10, further comprising:
a storage capacitor between the substrate and the first semiconductor layer, wherein the storage capacitor includes the first conductive pattern, a metal layer that overlaps the first conductive pattern, and the insulating layer interposed therebetween,
wherein the first transistor includes;
a gate electrode integrally formed with the metal layer;
the active pattern disposed on the gate electrode; and
source and drain electrodes each connected to respective ends of the active pattern.

12. The display device of claim 10, further comprising:
a storage capacitor that includes a lower electrode disposed on the active pattern, an upper electrode that overlaps the lower electrode, and an interlayer insulating layer interposed therebetween,
wherein the lower electrode is integrally formed the second conductive pattern,
wherein the first transistor includes:
a gate electrode integrally formed with the first conductive pattern;
the active pattern disposed on the gate electrode; and
source and drain electrodes each connected to respective ends of the active pattern,
wherein the interlayer insulating layer is disposed on the insulating layer.

* * * * *